US012347655B2

(12) United States Patent
Kim

(10) Patent No.: US 12,347,655 B2
(45) Date of Patent: Jul. 1, 2025

(54) ELECTROMAGNETIC FILTER AND PLASMA PROCESSING APPARATUS HAVING THE SAME

(71) Applicant: FNS.INC., Yongin-si (KR)

(72) Inventor: Kwankoo Kim, Yongin-si (KR)

(73) Assignee: FNS.INC., Yongin-si (KR)

( * ) Notice: Subject to any disclaimer, the term of this patent is extended or adjusted under 35 U.S.C. 154(b) by 21 days.

(21) Appl. No.: 18/535,972

(22) Filed: Dec. 11, 2023

(65) Prior Publication Data

US 2024/0212993 A1    Jun. 27, 2024

(30) Foreign Application Priority Data

Dec. 23, 2022 (KR) .................. 10-2022-0182641

(51) Int. Cl.
*H01F 27/36* (2006.01)
*H01F 27/02* (2006.01)
*H01J 37/32* (2006.01)

(52) U.S. Cl.
CPC ........ *H01J 37/32651* (2013.01); *H01F 27/02* (2013.01); *H01F 27/363* (2020.08); *H01J 37/32724* (2013.01)

(58) Field of Classification Search
CPC .............................. H01F 27/02; H01F 27/363
See application file for complete search history.

(56) References Cited

U.S. PATENT DOCUMENTS

| | | | |
|---|---|---|---|
| 6,218,913 B1 * | 4/2001 | Pagenkopf | H03H 1/0007 333/185 |
| 7,547,987 B2 * | 6/2009 | Torigoe | H02M 7/003 307/10.1 |
| 10,332,728 B2 | 6/2019 | Okunishi | |
| 10,720,305 B2 | 7/2020 | Van Zyl | |
| 2004/0084199 A1 * | 5/2004 | Chereson | H01G 4/40 174/359 |

(Continued)

FOREIGN PATENT DOCUMENTS

| | | |
|---|---|---|
| KR | 10-2014-0050560 A | 4/2014 |
| KR | 10-2021-0104856 A | 8/2021 |

(Continued)

OTHER PUBLICATIONS

International Search Report dated Apr. 3, 2024 as received in Application No. PCT/KR2023/020243.

*Primary Examiner* — Hung V Ngo
(74) *Attorney, Agent, or Firm* — Maschoff Brennan

(57) ABSTRACT

The present disclosure provides an electromagnetic filter structure. An electromagnetic filter according to the present disclosure includes a housing made of an electrically conductive metal material, an input port and an output port each provided on one of both facing side surfaces of the housing, a base plate made of an electrically insulating material and installed above a bottom surface of the housing, an inductor including a flat wire coil having a center axis disposed perpendicular to an upper surface of the base plate and installed on the upper surface of the base plate to be connected to the output port, and a plurality of conductive plates fixed to the upper surface of the base plate and connecting between the input port and the inductor and between the output port and the inductor.

18 Claims, 18 Drawing Sheets

(56) References Cited

U.S. PATENT DOCUMENTS

| | | | |
|---|---|---|---|
| 2009/0140826 A1* | 6/2009 | Chereson | H01G 4/38 |
| | | | 333/167 |
| 2011/0084782 A1* | 4/2011 | Kanno | H02J 50/70 |
| | | | 333/202 |
| 2015/0270064 A1 | 9/2015 | Sakamoto et al. | |
| 2023/0037631 A1 | 2/2023 | Shin | |
| 2024/0120146 A1 | 4/2024 | Yeom et al. | |

FOREIGN PATENT DOCUMENTS

| KR | 10-2372134 B1 | 3/2022 |
|---|---|---|
| KR | 10-2022-0111873 A | 8/2022 |

* cited by examiner

[FIG. 1]
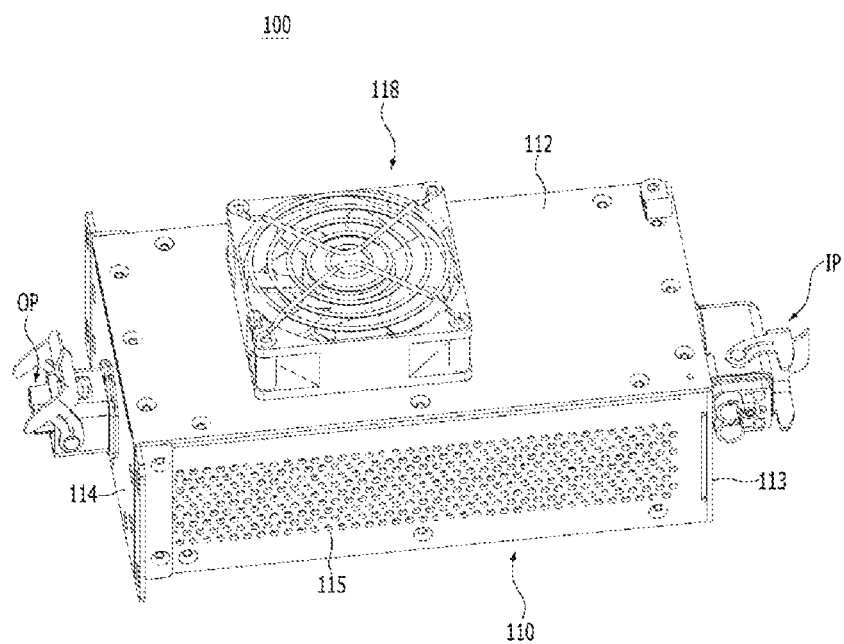

【FIG. 2】
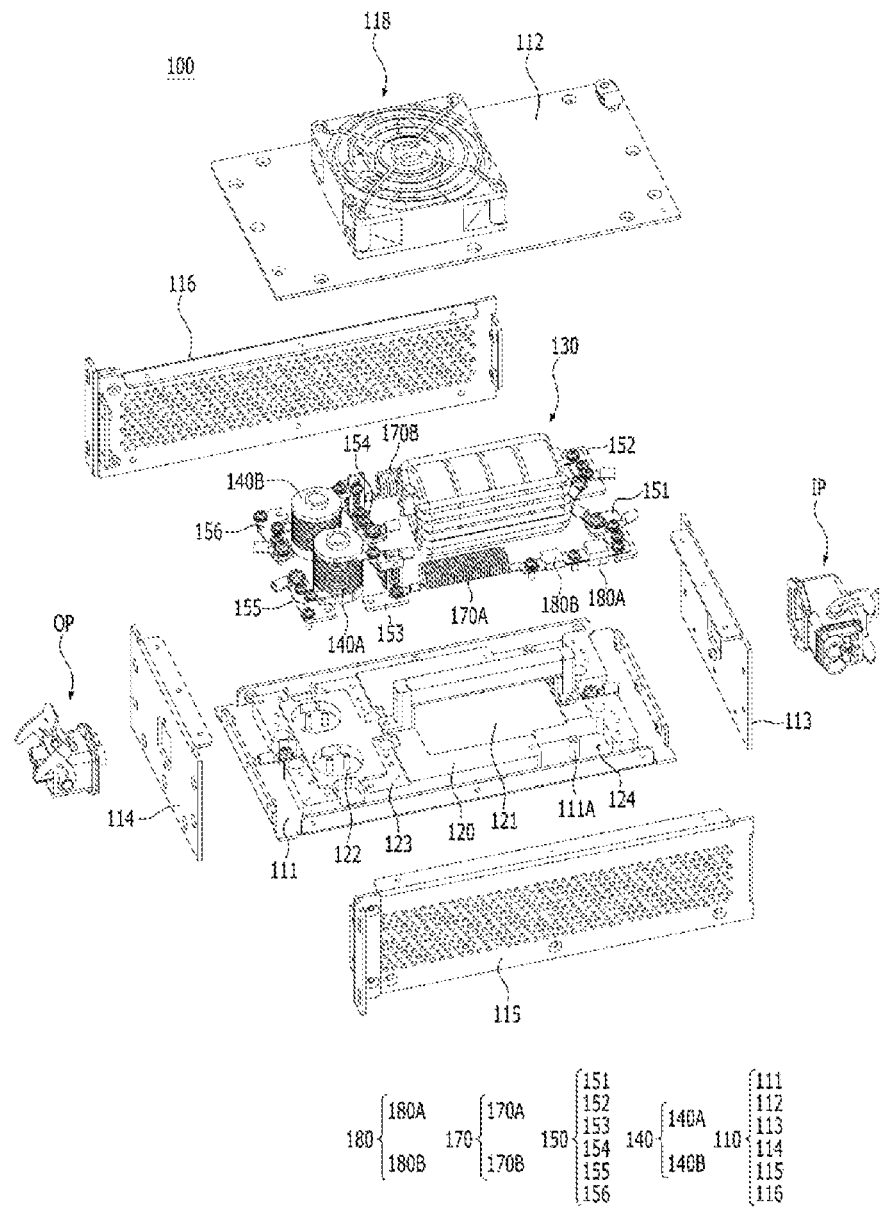

[FIG. 3]
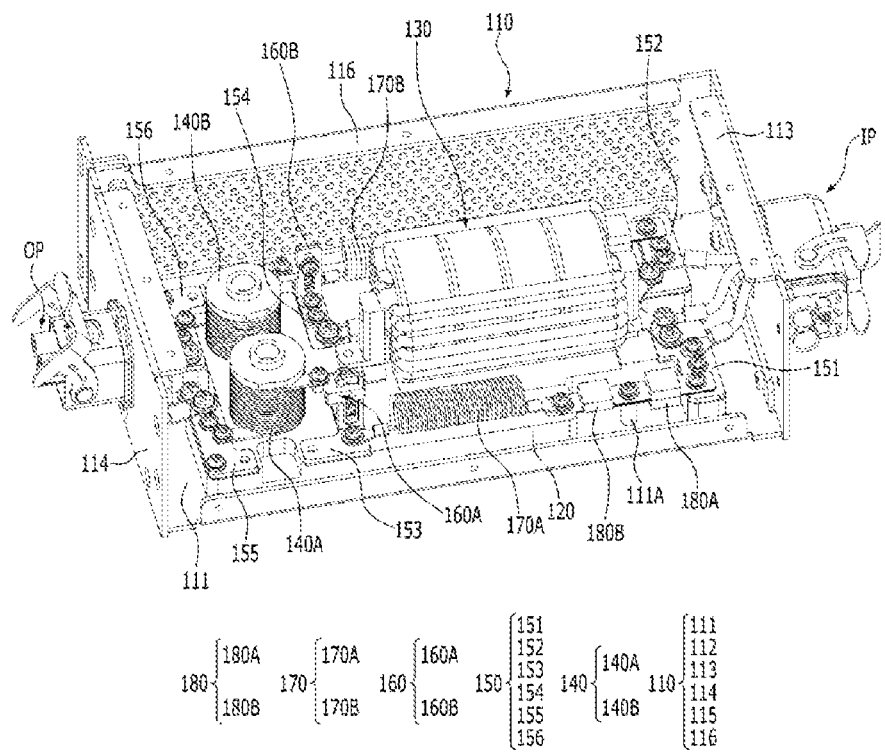

[FIG. 4]
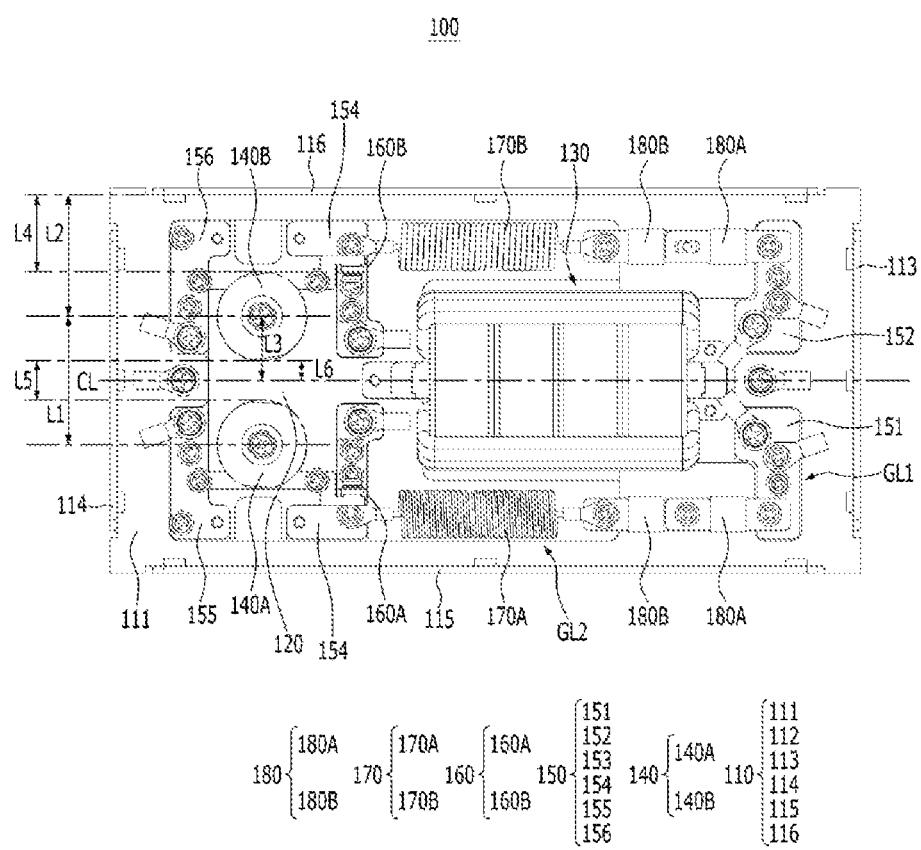

[FIG. 5]
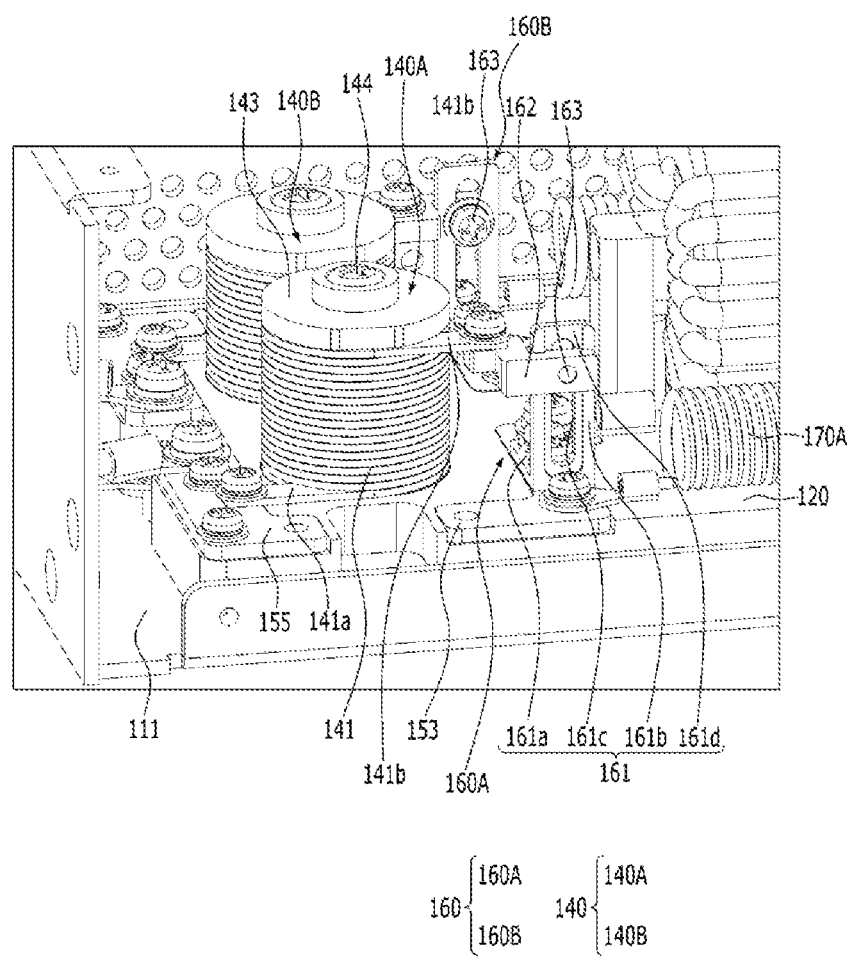

[FIG. 6]
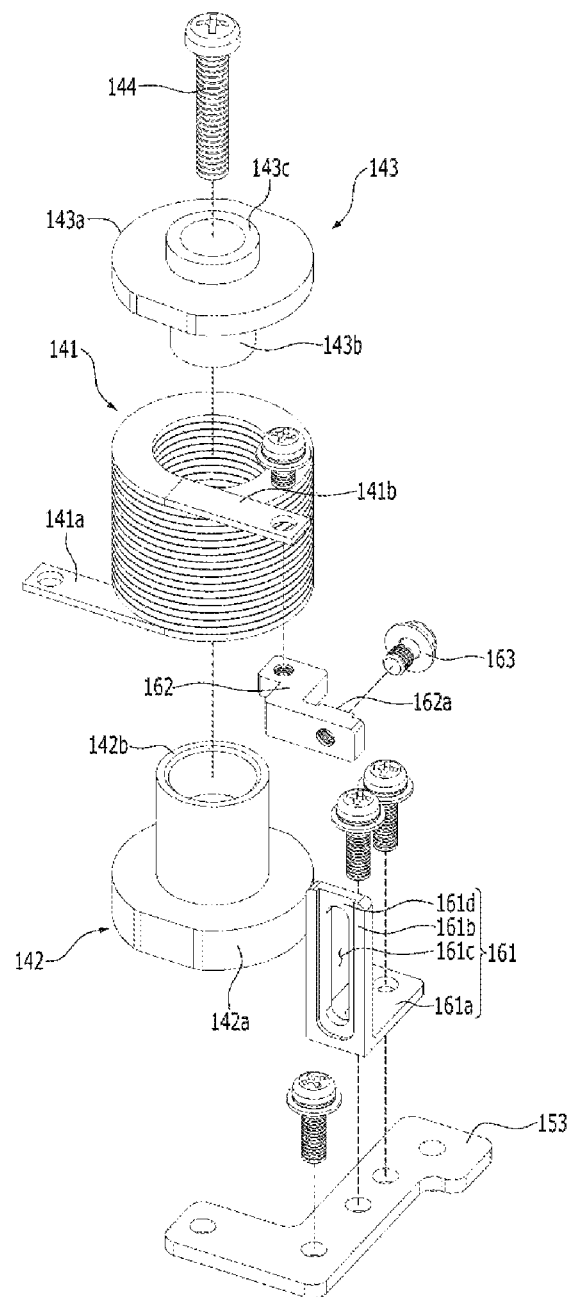

[FIG. 7]
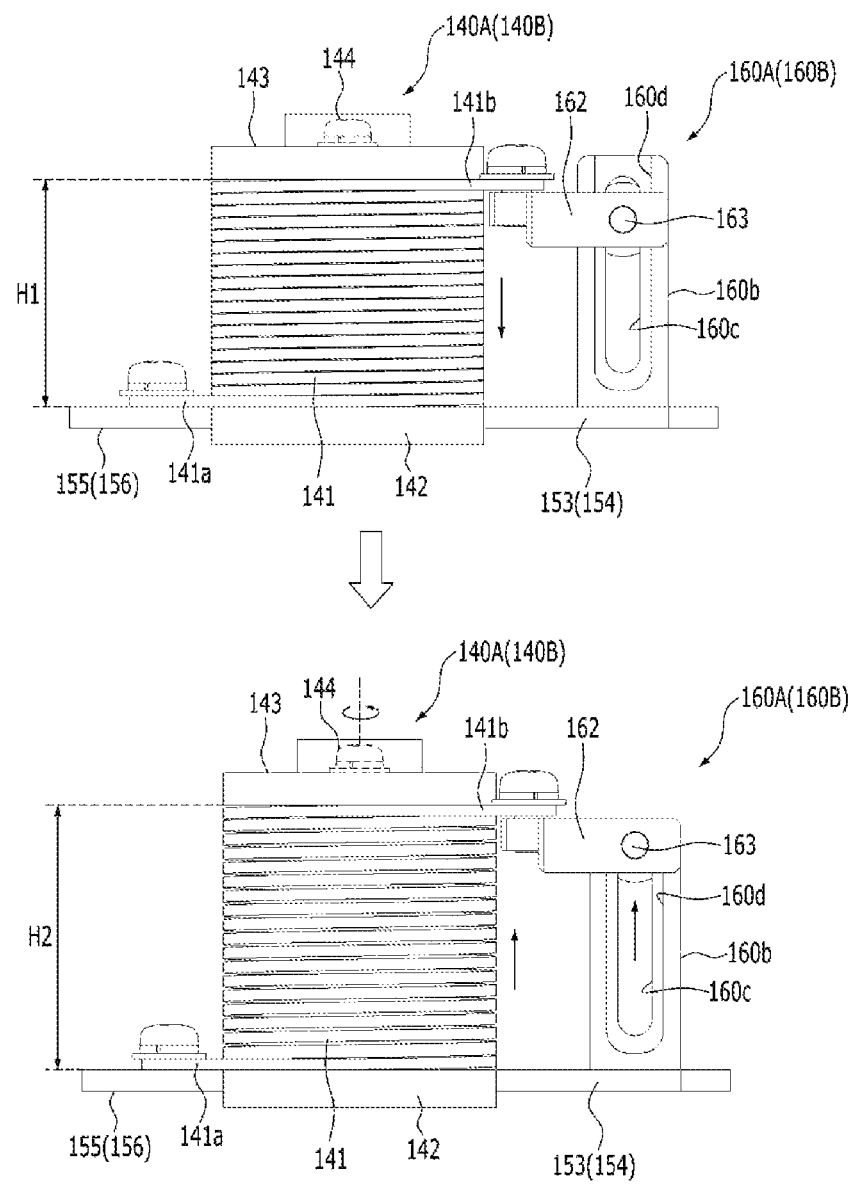

[FIG. 8]
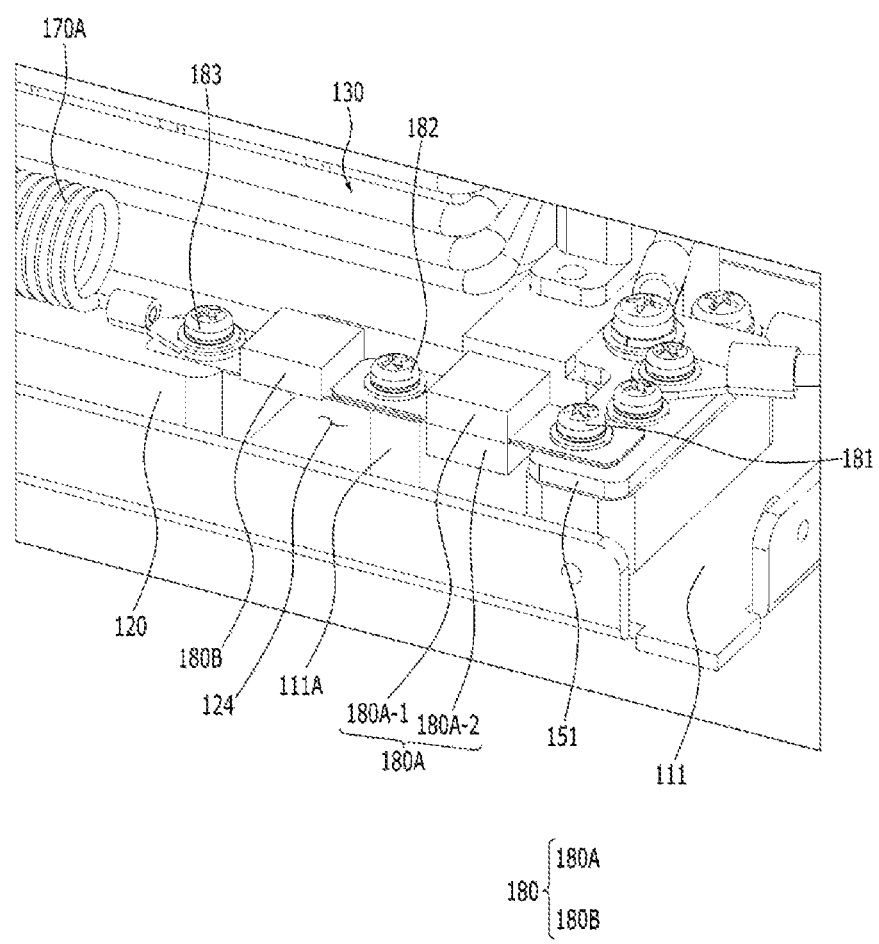

[FIG. 9]
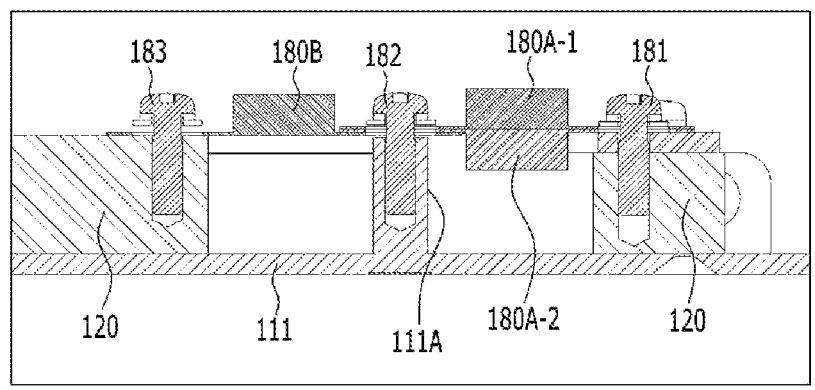

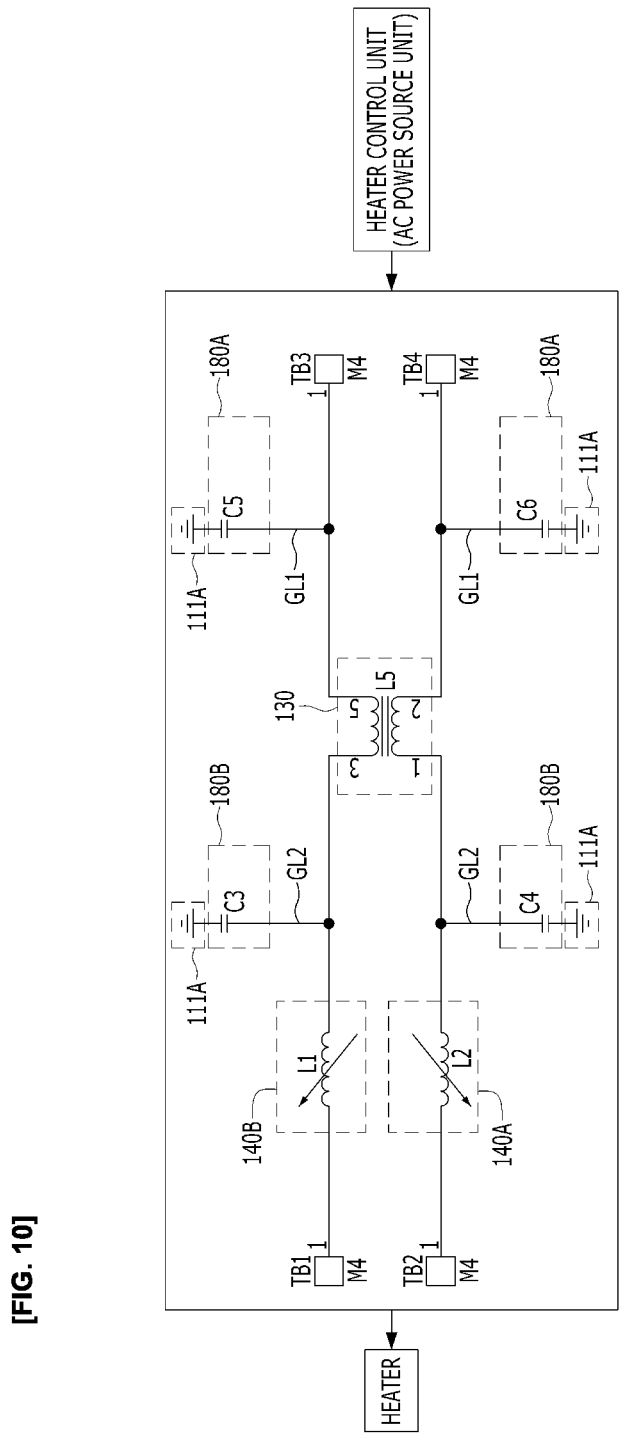
[FIG. 10]

【FIG. 11】
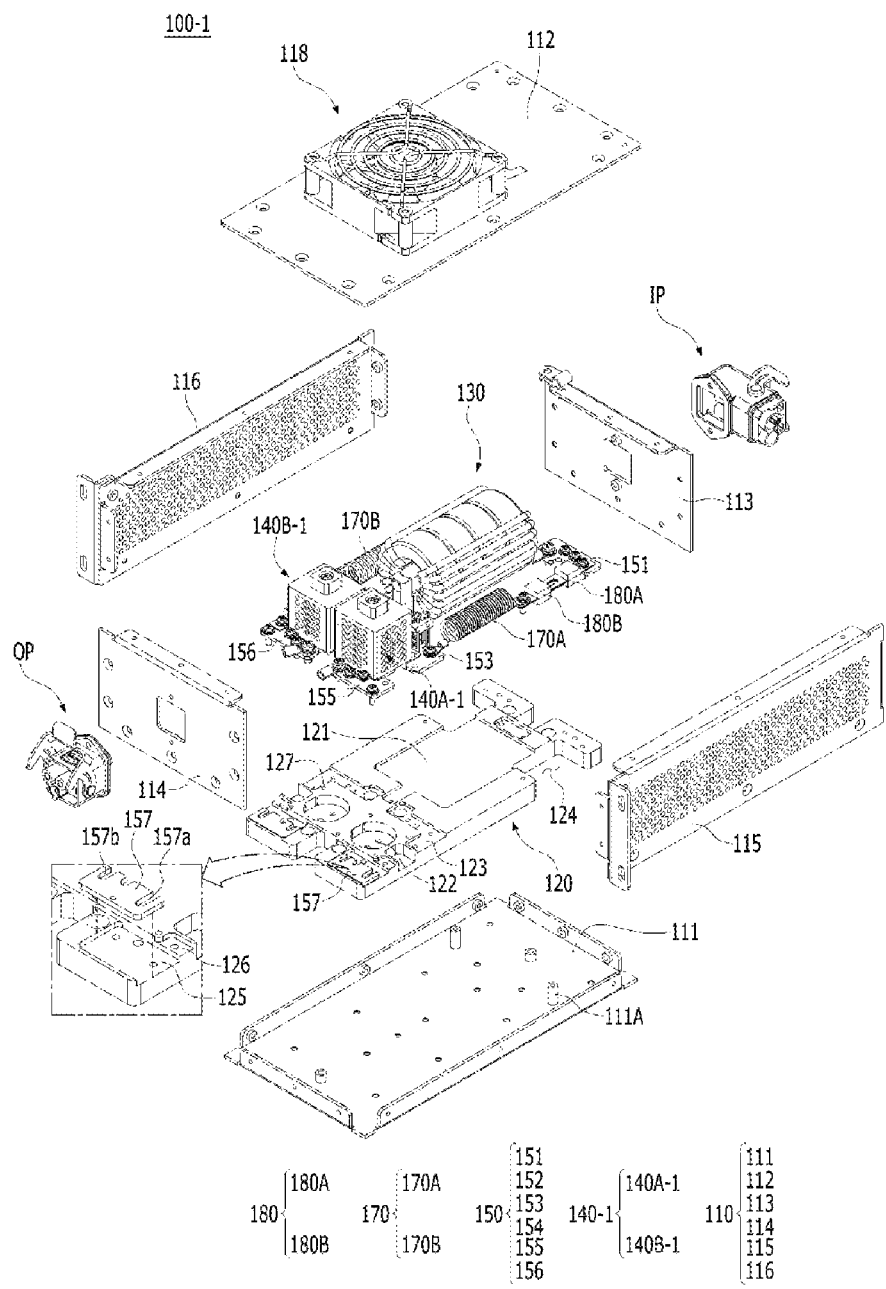

[FIG. 12]
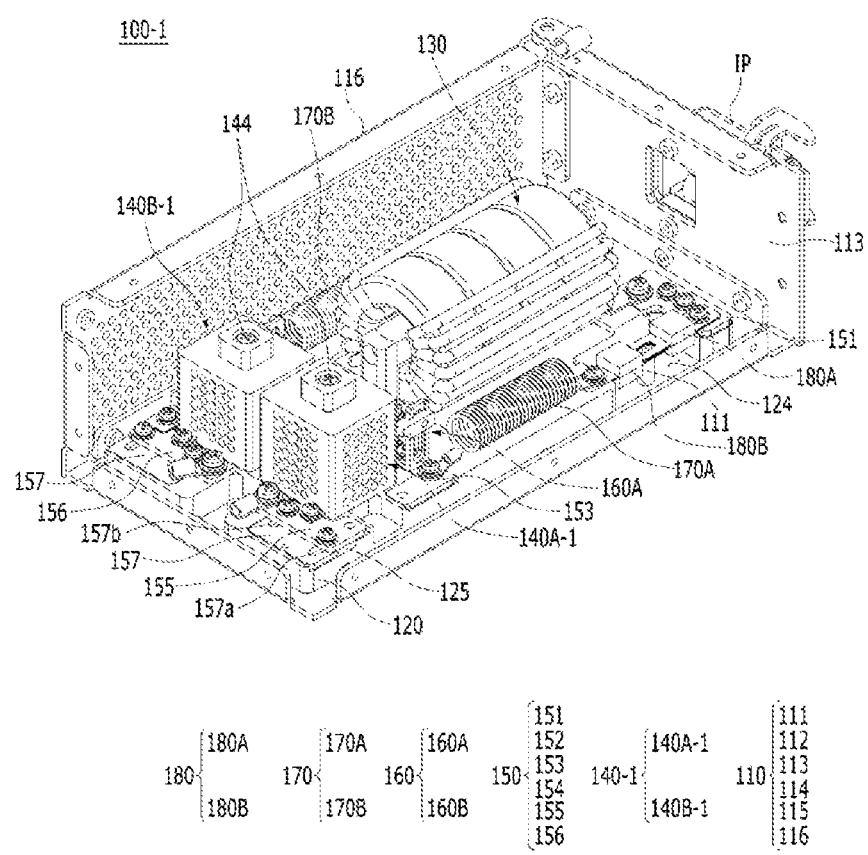

[FIG. 13]
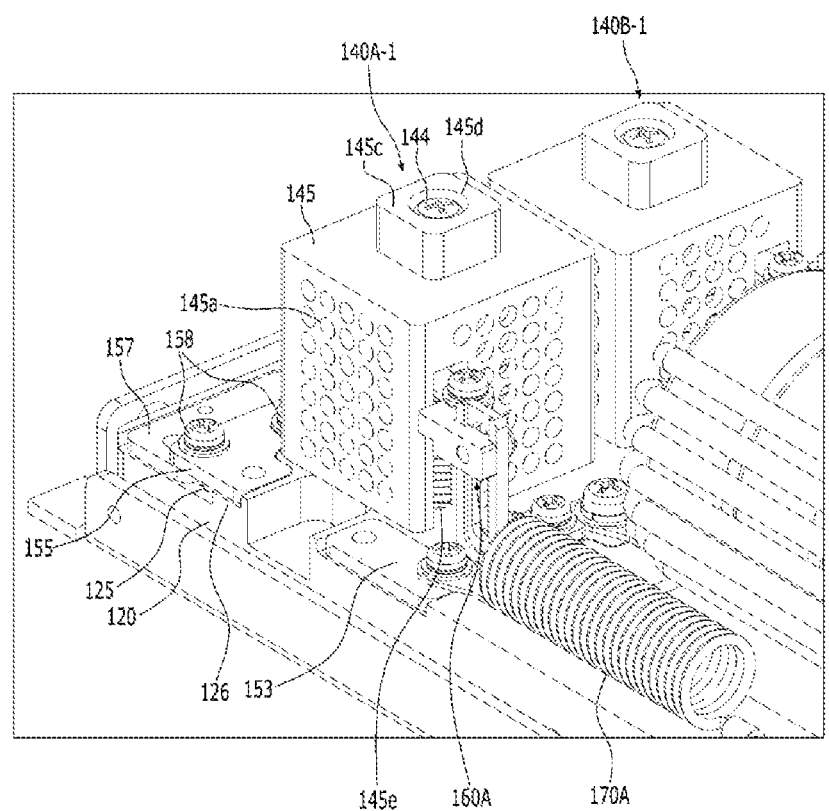

[FIG. 14]
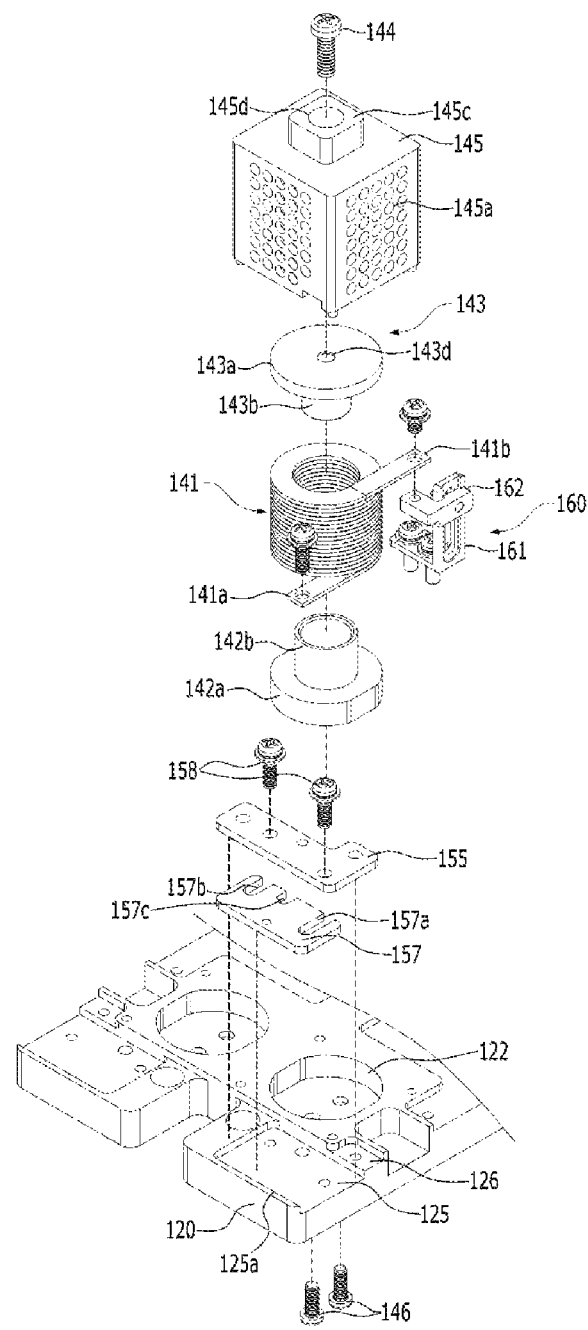

[FIG. 15]
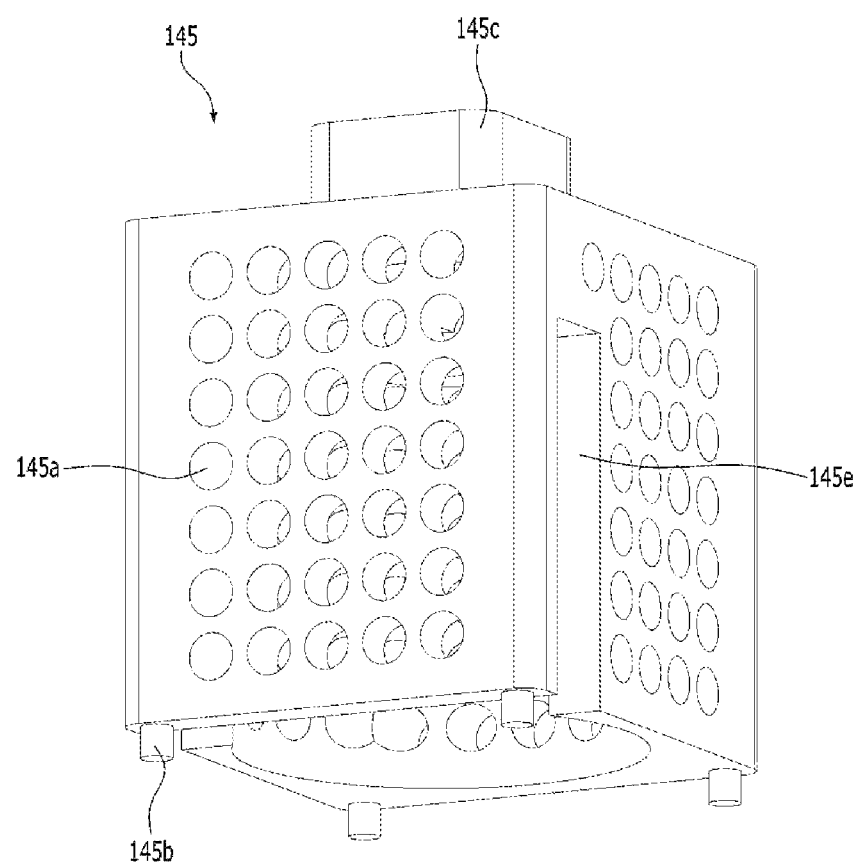

[FIG. 16]
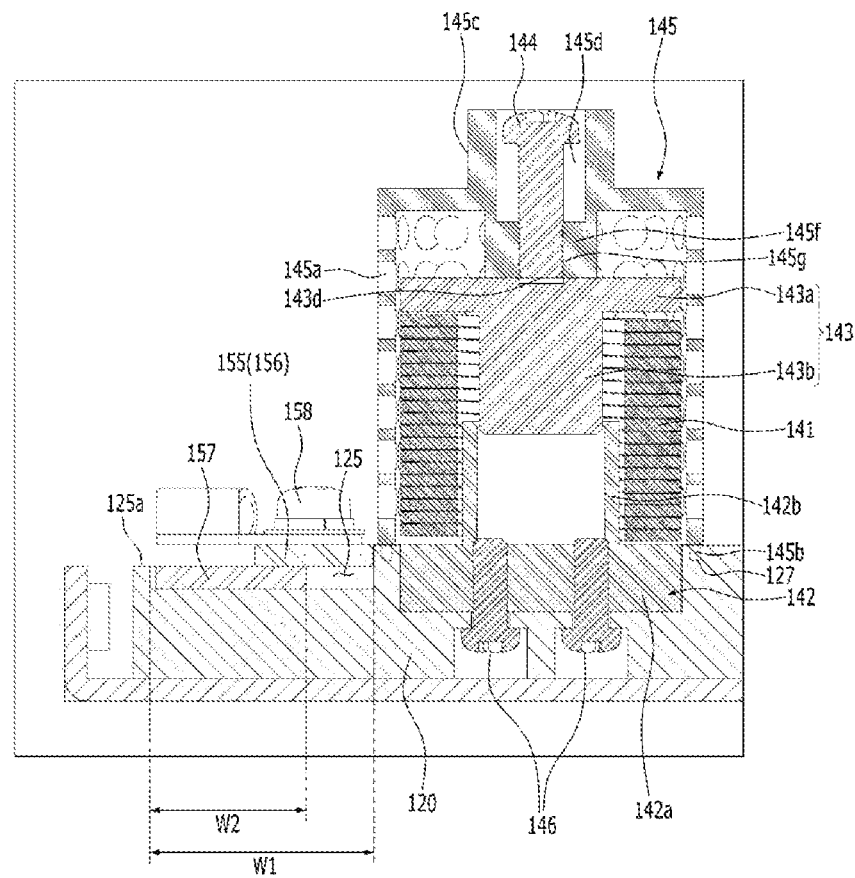

[FIG. 17]
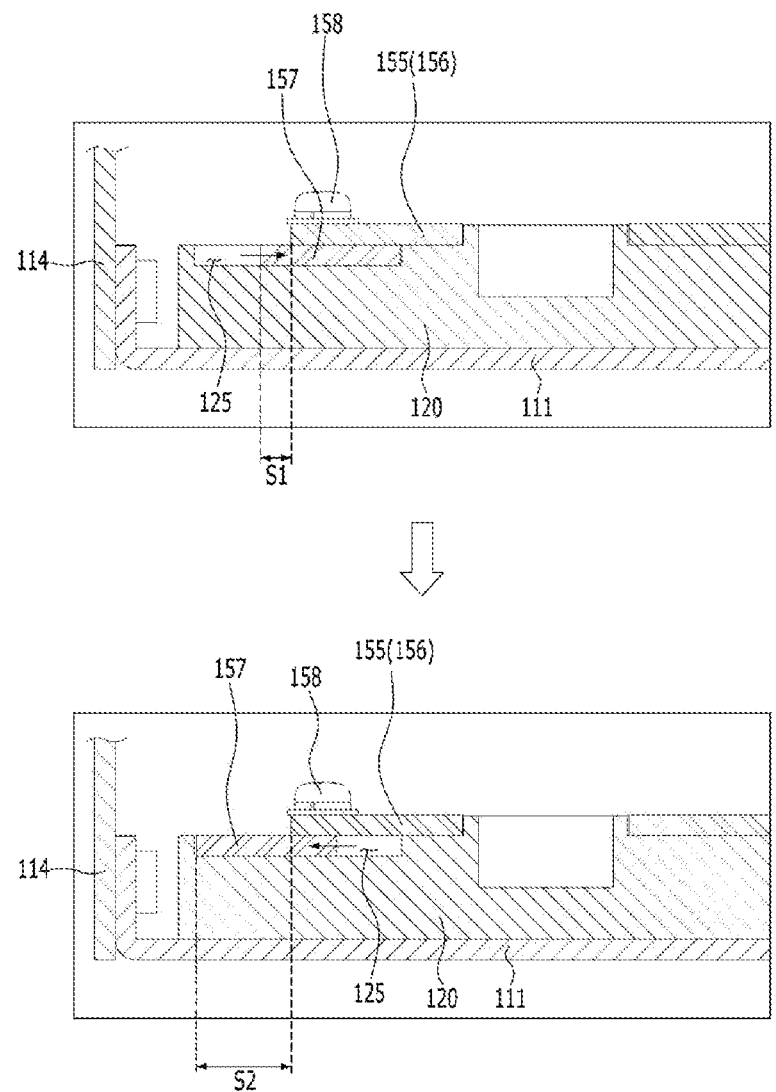

[FIG. 18]
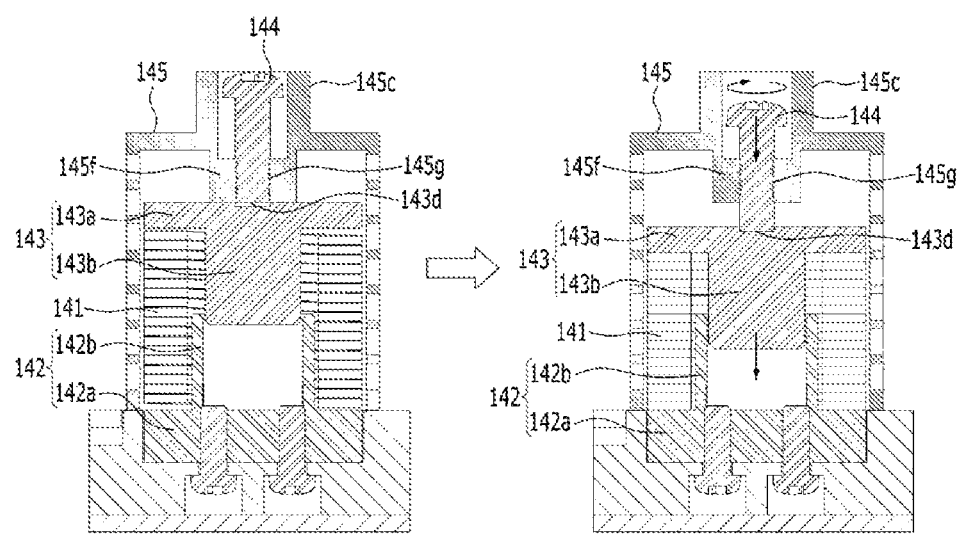

ELECTROMAGNETIC FILTER AND PLASMA PROCESSING APPARATUS HAVING THE SAME

TECHNICAL FIELD

The present disclosure relates to an electromagnetic filter, and for example, an electromagnetic filter installed on a connecting wire between a heater in a plasma chamber used in a semiconductor process and a power source unit of the heater.

BACKGROUND ART

In general, semiconductors are completed by performing several stages of processes, and recently, due to the high integration and miniaturization of semiconductors, processes using plasma have become widely used. In the processes using such plasma, plasma is generated through radiofrequency (RF) power, and etching or deposition is performed by using the generated plasma.

At this time, as high-voltage RF power generated by the plasma used in the process is transmitted to other peripheral devices, unexpected process deviations or malfunctions may occur. For example, when the RF power flows into a heater power source unit (or a heater control unit) through the heater in a plasma chamber, a deviation may occur in controlling heater temperatures. Plasma-induced RF noises are an element that may not predicted before the process, and the resulting process deviation may reduce the precision or yield of the semiconductor.

Matters described above in the background art are intended to help understanding of the background of the disclosure and may include matters not related to the known related art.

SUMMARY OF INVENTION

Technical Problem

The present disclosure is directed to providing an electromagnetic filter capable of preventing high-voltage RF power generated in a plasma chamber in a semiconductor process from flowing into a heater control unit through a heater in the chamber, and a plasma substrate processing apparatus including the electromagnetic filter.

The present disclosure is also directed to providing an electromagnetic filter capable of variably adjusting a parasitic capacitance inside the electromagnetic filter, and a plasma substrate processing apparatus including the electromagnetic filter.

Solution to Problem

An electromagnetic filter according to the present disclosure for achieving the object includes a housing made of an electrically conductive metal material, an input port and an output port each provided on one of both facing side surfaces of the housing, a base plate made of an electrically insulating material and installed above a bottom surface of the housing, an inductor including a flat wire coil having a center axis disposed perpendicular to an upper surface of the base plate and installed on the upper surface of the base plate to be connected to the output port, and a plurality of conductive plates fixed to the upper surface of the base plate and connecting between the input port and the inductor and between the output port and the inductor.

Advantageous Effects of Invention

According to the structure of the electromagnetic filter of the present disclosure, by installing the base plate, which is an insulator, on the bottom surface of the housing made of a conductive material, installing the flat wire coil constituting the inductor on the base plate so that a center axis is perpendicular to the upper surface of the base plate, and circuitically configured to be connected between the input port and the output port of the housing through the plurality of conductive plates fixed to the upper surface of the base plate, since the high-voltage RF power generated in the process of generating plasma in the semiconductor process is filtered through the inductor when flowing into the filter along the connecting wire of the heater in the chamber, it is possible to solve the process deviation problem occurring due to the backflow of the high-voltage RF power into the heater control unit side through the filter.

In addition, by forming the coil constituting the inductor as the flat wire coil having a rectangular cross-sectional shape, since integration is high compared to the conventional annular coil, it is possible to achieve miniaturization and high output, and since deformation is relatively less due to a high modulus of elasticity compared to the circular cross-sectional coil, it is possible to very precisely adjust the inductance of the flat wire coil by adjusting the height of the flat wire coil to the fine level at the time of adjusting the height of the flat wire coil using the bolt.

In addition, by arranging the pair of flat wire coils at the symmetrical positions with respect to the center line of the housing in the longitudinal direction, forming the winding directions of the flat wire coils in opposite directions, and forming the flat wire coils so that the upper end portions of the flat wire coils are disposed symmetrically at the positions furthest from the center line of the housing in the longitudinal direction, it is possible to improve the filtering performance of the RF power by maintaining the balance of the circuit configuration through the two flat wire coils disposed symmetrically, thereby minimizing the inductance interference between the two flat wire coils.

In addition, by forming the shortest distance between the center of the flat wire coil adjacent to the side surface of the housing and the side surface of the housing to be larger than the distance between the centers of the flat wire coils, it is possible to prevent the degradation in performance due to the inductance interference between the flat wire coil formed of a conductor and the side surface of the housing.

In addition, by arranging the lower support member and the upper support member above and under the flat wire coil, respectively and constituting the flat wire coil to be elastically compressed between the lower support member and the upper support member by fastening the upper support member to the lower support member using the bolt, it is possible to freely adjust the inductance of the flat wire coil to the desired value by tightening or loosening the bolt provided on the upper end of the inductor if necessary.

In addition, by installing the height adjustment unit between the upper end portion of the flat wire coil and the conductive plate, since the separation distance between the upper end portion of the flat wire coil and the conductive plate is adjusted to fit a changed height even when the height of the flat wire coil is changed, it is possible to allow power to stably flow between the flat wire coil and the conductive plate even when the height of the flat wire coil is changed and solve the problem that a portion of the flat wire coil is deformed when the height of the flat wire coil is changed.

In addition, by providing the height adjustment unit including the bent member composed of the horizontal portion coupled to the conductive plate and the vertical portion having the long hole, the connecting member connecting the upper end portion of the flat wire coil to the vertical portion, and the bolt fastened to the vertical portion through the connecting member, it is possible to adjust the height of the flat wire coil through the simple process of loosening the bolt fastening the connecting member to the vertical portion at the time of adjusting the height of the coil for adjusting the inductance of the flat wire coil, adjusting the height of the upper end portion of the flat wire coil, and then fixedly re-tightening the bolt, thereby very easily performing the operation of adjusting the inductance of the flat wire coil.

In addition, by forming the guide groove in the vertical portion and forming the guide protrusion that can be slid by being engaged with the guide groove, since the connecting member can move along the predetermined path on the vertical portion without shaking in the left-right direction and the coupling position between the vertical portion and the connecting member can maintain a coupling state of being positioned at the predetermined coupling position without misplaced in the left-right direction, it is possible to improve structural connection stability.

In addition, by forming the materials of the upper support member and the lower support member constituting the inductor as a polyetheretherketone (PEEK) material having high mechanical strength and excellent heat resistance and chemical resistance, it is possible to secure stable durability even when repeatedly used in the high-temperature harsh environment.

In addition, it is possible to implement the stable ground structure in which the capacitors connected to the first ground line and the second ground line are grounded to be connected to the bottom surface of the housing through the grounding support formed of a conductor while stably supported through the base plate portion and the grounding support portion.

In addition, by applying the structure in which the capacitors are grounded to the housing by allowing the end portions of the neighboring two capacitors in the horizontal direction to overlap each other or the end portions of the neighboring two capacitors in the vertical direction to overlap each other and being fastened to the upper end of the grounding support using the bolt, it is possible to implement the efficient ground structure using the minimum number of grounding supports and the bolt, thereby achieving space arrangement utilization more efficiently in mounting the plurality of capacitors inside the housing.

In addition, by installing the variable plate which is electrically connected to the conductive plate and of which a position is moved at the predetermined distance in the horizontal direction on the lower position of the conductive plate, since the effective conductor area overlapping the bottom surface of the housing can be changed by the position movement of the variable plate relative to the conductive plate, it is possible to variably adjust the parasitic capacitance generated between the variable plate and the bottom surface of the housing if necessary.

In addition, by forming the protruding wall in the accommodation groove portion positioned between the variable plate and the side surface of the housing and allowing the protruding wall positioned between the variable plate and the side surface of the housing to function as the dielectric, it is possible to generate the parasite capacitance between the variable plate and the side surface of the housing. In this case, when the horizontal width of the protruding wall functioning as the dielectric between the variable plate and the side surface of the housing is adjusted, it is possible to variably adjust the parasitic capacitance.

In addition, the horizontal distance at which the variable plate can move with respect to the side surface of the housing due to the mechanical design structure inside the electromagnetic filter is inevitably limited, but when the horizontal width, the material, the shape, or the like of the protruding wall functioning as the dielectric between the variable plate and the side surface of the housing is changed, it is possible to secure various parasitic capacitance values despite the limited horizontal movement distance of the variable plate.

BRIEF DESCRIPTION OF DRAWINGS

FIG. 1 is a perspective view illustrating an exterior structure of an electromagnetic filter according to a first embodiment of the present disclosure.

FIG. 2 is an exploded perspective view of the electromagnetic filter illustrated in FIG. 1.

FIG. 3 is a perspective view illustrating an interior structure of the electromagnetic filter according to the first embodiment of the present disclosure.

FIG. 4 is a plan view illustrating the arrangement relationship of components constituting the electromagnetic filter according to the first embodiment of the present disclosure.

FIG. 5 is an enlarged perspective view specifically illustrating major parts in a connecting structure of a flat wire coil constituting an inductor and a height adjustment unit according to the first embodiment of the present disclosure.

FIG. 6 is an exploded perspective view illustrating a structure of the inductor and the height adjustment unit according to the first embodiment of the present disclosure.

FIG. 7 is an operation exemplary view illustrating a state of adjusting a height of the height adjustment unit according to a change in height of the flat wire coil according to a tightening/loosening operation of a bolt.

FIG. 8 is an enlarged perspective view illustrating major parts of a capacitor support structure by a grounding support according to the first embodiment of the present disclosure.

FIG. 9 is a cross-sectional view illustrating a cross-sectional state of FIG. 8.

FIG. 10 is a circuit diagram illustrating a circuit configuration of the electromagnetic filter according to the present disclosure.

FIG. 11 is an exploded perspective view of an electromagnetic filter according to a second embodiment of the present disclosure.

FIG. 12 is a perspective view illustrating an interior structure of the electromagnetic filter according to the second embodiment of the present disclosure.

FIG. 13 is an enlarged perspective view of a portion in which a variable plate and the inductor are installed viewed in another direction in FIG. 12.

FIG. 14 is an enlarged perspective view illustrating major parts of a specific configuration of the variable plate and the inductor in FIG. 12.

FIG. 15 is a detailed view specifically illustrating a coil cover structure illustrated in FIG. 14.

FIG. 16 is a cross-sectional view specifically illustrating major parts of a cross-sectional structure of the portion in which the variable plate and the inductor are installed.

FIG. 17 is a cross-sectional view illustrating a comparison of a state in which the variable plate is moved minimally and maximally under a conductive plate.

FIG. 18 is an operation exemplary view illustrating a state in which a height of a flat wire coil is adjusted by the rotation of the bolt in the inductor according to the second embodiment of the present disclosure.

DESCRIPTION OF EMBODIMENTS

Hereinafter, embodiments of the present disclosure will be described in detail with reference to the accompanying drawings so that those skilled in the art can easily carry out the present disclosure.

However, the present disclosure may be implemented in various different forms and is not limited to the embodiments described herein. In addition, it should be noted that parts denoted by the same reference numerals throughout the detailed description indicate the same components.

A plasma substrate processing apparatus according to the present disclosure includes a plasma chamber having a processing space therein, a substrate support unit for supporting a substrate (wafer) in the processing space of the plasma chamber, a gas supply unit for supplying a gas to the inside of the processing space, and a plasma generating unit for generating plasma from the gas supplied to the inside of the processing space by applying high frequency power to the inside of the plasma chamber.

In addition, the plasma substrate processing apparatus according to the present disclosure further includes a heater unit for controlling a temperature of the substrate. The heater unit includes a heater installed on the substrate support unit, a heater control unit (or an alternating current (AC) power supply unit) for supplying and controlling AC power to the heater, and a filter unit for preventing coupling of high-frequency AC power between the heater and the heater control unit. In addition, the filter unit includes an electromagnetic filter for blocking (filtering) the high-frequency AC power supplied from the heater control unit, and a filter control unit for preventing a degradation in performance of the electromagnetic filter.

In the plasma substrate processing apparatus according to the present disclosure, the electromagnetic filter may be a filter capable of blocking electromagnetic waves (i.e., noise) caused by RF plasma and may be, for example, an electromagnetic filter for a plasma chamber.

The electromagnetic filter for a plasma chamber according to the present disclosure is an electromagnetic filter for a plasma chamber connected to a connecting wire between the heater installed inside the plasma chamber for performing a semiconductor process and the heater control unit (or an AC power supply unit) for supplying and controlling the AC power to the heater.

In a typical semiconductor process, an optimal process temperature is maintained by applying the AC power to the heater installed under the substrate (wafer) in the plasma chamber and controlling a temperature between a reaction gas and the substrate by heat generated from the heater. However, unexpected process deviations are caused by the occurrence of high-voltage reverse introduction in which the high-voltage RF power generated by plasma in the semiconductor process flows into the heater control unit through the heater installed in the plasma chamber.

In addition, process deviations may occur by affecting an RF impedance of the plasma chamber due to parasitic capacitors, parasitic inductors, and the like that are present between a connecting portion of the heater and the electromagnetic filter in the plasma chamber. The process deviations caused by various factors negatively affect the semiconductor process, resulting in a problem that the precision of the semiconductor substrate is eventually degraded.

In order to solve the process deviation problem due to the reverse introduction of the high-voltage RF power generated in the plasma process, the present disclosure provides an electromagnetic filter structure capable of effectively filtering the high-voltage RF power flowing into the heater control unit side through the heater in the plasma chamber.

Meanwhile, the electromagnetic filter according to embodiments of the present disclosure may be connected not only to the heater in the plasma chamber, but also to other components that may be affected by the plasma generated in the plasma chamber. For example, the electromagnetic filter according to the embodiments of the present disclosure may be connected to an electrostatic chuck for electrically fixing the substrate (wafer). In this case, the electromagnetic filter can prevent the high-voltage RF power from flowing into the power supply unit of the electrostatic chuck. For convenience of description, the following description will be made assuming that the electromagnetic filter according to the embodiments of the present disclosure is connected to the heater side.

FIG. 1 is a perspective view illustrating an exterior structure of an electromagnetic filter according to a first embodiment of the present disclosure, and FIG. 2 is an exploded perspective view illustrating a specific configuration of the electromagnetic filter according to the first embodiment of the present disclosure. In addition, FIG. 3 is a perspective view illustrating an interior structure of the electromagnetic filter according to the first embodiment of the present disclosure, and FIG. 4 is a plan view illustrating the arrangement relationship of components constituting the electromagnetic filter according to the first embodiment of the present disclosure.

Referring to FIGS. 1 to 4, an electromagnetic filter 100 (hereinafter referred to as "filter") for a plasma substrate processing apparatus according to the first embodiment of the present disclosure includes a housing 110 made of a conductive material, which forms an exterior of the electromagnetic filter, a base plate 120 made of an insulating material, which is installed on an inner bottom surface 111 of the housing 110, and a pair of inductors 140 installed on an upper surface of the base plate 120 and circuitically configured to be connected between an input port IP and an output port OP of the housing 110 through a plurality of conductive plates 150.

The housing 110 has a rectangular box shape and is made of an electrically conductive metal material. The housing 110 is composed of the bottom surface 111 and an upper surface 112 formed in a rectangular plate shape, and four side surfaces 113, 114, 115, and 116 formed in a rectangular plate shape, which form an edge between the bottom surface 111 and the upper surface 112.

The housing 110 includes the input port IP and the output port OP respectively provided on both side surfaces 113 and 114 facing each other in a longitudinal direction. The input port IP is connected to the heater control unit (or the AC power supply unit) side to receive AC power from the heater control unit, and the output port OP is connected to the heater (not illustrated) side installed in the plasma chamber to output the AC power to the heater.

A base plate 120 in the rectangular plate shape having a predetermined height (thickness) is mounted on the bottom surface 111 of the housing. The base plate 120 is made of an electrically insulating material such as plastic and is fixed to the bottom surface 111 of the housing through a plurality of bolts that pass through the housing upward from a lower portion of the bottom surface 111 of the housing. In addition, a fan 118 for discharging heat generated inside the electromagnetic filter 100 to the outside is provided on the upper surface 112 side of the housing.

Since the conventional filter uses a printed circuit board (PCB) having a conductor circuit pattern on the bottom surface of the housing, a parasitic resistance value of a filter impedance is increased by the conductor pattern on the PCB, resulting in a low quality factor (Q factor) of the filter.

However, the electromagnetic filter 100 of the present disclosure can minimize the parasitic resistance value of the filter impedance using the base plate 120 formed of an insulator instead of the conventional PCB, thereby improving the Q factor of the filter. For example, the Q factor of the electromagnetic filter according to the present disclosure may exceed 1, and preferably, exceed 20. Furthermore, since the parasitic resistance value of the filter impedance is minimized, an impedance change due to the installation of the filter is also reduced.

A transformer 130 is mounted on the base plate 120. According to the embodiments, the transformer 130 may be a ferrite-type transformer having a ring shape and having a wire wound around a plurality of stacked ferrite cores. The transformer 130 is seated on the upper surface of the base plate 120 through a separate support structure and fixed with bolts.

The transformer 130 is seated in a seating groove 121 formed in a recessed form on the upper surface of the base plate 120 and connects in series between the input port IP and the inductor 140 through a plurality of conductive plates 150 fixed to the upper surface of the base plate 120.

In other words, since (+), (−), and ground wires may be inserted from the input port IP into the housing 110 and connected to conductive plates 151 and 152, and the corresponding wires drawn out from the transformer 130 side may be connected to the conductive plates 151 and 152 at one side fixed to the upper surface of the base plate 120, the transformer 130 may be electrically connected to the input port IP.

A pair of inductors 140A and 140B are installed between the transformer 130 and the output port OP. The inductors 140A and 140B are seated in the seating groove 122 formed on the upper surface of the base plate 120 and fixed with bolts and have one end portions connected to the transformer 130 through conductive plates 153 and 154 and the other end portions connected to the output port OP through conductive plates 155 and 156.

The inductors 140A and 140B may include a coil 141. According to the embodiments, the coil 141 may be an air coil having a cavity at the center thereof. For example, the coil 141 may be the flat wire coil 141 around which a flat wire having a rectangular cross-sectional shape is wound in a state of having a cavity at the center thereof. The flat wire coil may have a relatively high inductance for the same volume because it has a relatively high winding density. For convenience of description, the following description will be made assuming that the coil 141 is the flat wire coil 141, but the embodiments of the present disclosure are not limited to a specific form of the coil 141.

The coil 141 may have the center axis disposed in a height direction with respect to the upper surface of the base plate 120. For example, the coil 141 has the center axis substantially vertically disposed with respect to the upper surface of the base plate 120 and is disposed on the upper surface of the base plate 120 in the form of being upright in a vertical direction (vertical direction).

In the specification, when the coil is disposed in the height direction, it may mean that one end of the coil and the other end of the coil are positioned at substantially different heights. For example, the coil disposed in the height direction may have a height difference between the one end of the coil and the other end of the coil that is larger than or equal to half a length of the coil.

A plurality of conductive plates 150 may be disposed on the upper surface of the base plate 120. The plurality of conductive plates 150 are formed in different shapes and electrically and mutually connect the input port IP, the transformer 130, the inductor 140, and the output port OP on the upper surface of the base plate 120. In other words, each of the plurality of conductive plates 150 function as one of wirings connecting the input port IP to the transformer 130, the transformer 130 to the inductor 140, and the inductor 140 to the output port OP.

Since the high-voltage AC power is applied to the electromagnetic filter 100, a plate-shaped conductive plate 150 that has a large area and is advantageous for high voltage transmission instead of conventional cables and wires is applied. The plurality of conductive plates 150 are fixedly fastened to the base plate 120 using a plurality of bolts without being fixed by a method such as soldering or the like. The plurality of conductive plates 150 may be made of a copper (Cu) material or formed in the form of being plated with copper (Cu) and silver (Ag).

The plurality of conductive plates 150 include the pair of first conductive plates 151 and 152 connecting the input port IP to the transformer 130, the pair of second conductive plates 153 and 154 connecting the transformer 130 to the inductor 140, and the pair of third conductive plates 155 and 156 connecting the inductor 140 to the output port OP.

The first conductive plates 151 and 152 connect the input port IP to the transformer 130 in series. In addition, a pair of first ground lines GL1, which are circuitically configured to be branched from the pair of first conductive plates 151 and 152 and grounded to the housing 110 made of a conductive material, are formed. The pair of first ground lines GL1 branched from the pair of first conductive plates 151 and 152 are disposed at both sides of the transformer 130 and connected to the housing 110 to form a ground structure. In this case, one or more capacitors 180A may be connected to the pair of first ground lines GL1 connected in parallel with the transformer 130.

In addition, the second conductive plates 153 and 154 connect the transformer 130 to the inductor 140 in series. In addition, a pair of second ground lines GL2, which are circuitically configured to be branched from the pair of second conductive plates 153 and 154 and grounded to the housing 110 made of a conductive material, are formed. The pair of second ground lines GL2 branched from the pair of second conductive plates 153 and 154 are disposed to face the pair of first ground lines GL1 at both sides of the transformer 130 and connected to the housing 110 to form a ground structure. In this case, one or more capacitors 180B may be connected to the pair of second ground lines GL2 connected in parallel with the transformer 130.

According to the embodiments, additional inductors 170A and 170B may be connected between the second conductive plates 153 and 154 and the capacitor 180B connected to the second ground line GL2. The additional inductors 170A and 170B may be air core inductors having a circular cross-section, but are not limited thereto. The additional inductors 170A and 170B may be optionally provided to adjust inductances in the electromagnetic filter.

Meanwhile, the pair of inductors 140A and 140B are disposed at symmetrical positions with respect to a center line CL of the housing 110 in the longitudinal direction and connected to the transformer 130 and the output port OP through the second conductive plates 153 and 154 and the third conductive plates 155 and 156.

In this case, the pair of flat wire coils 141 constituting the inductors 140A and 140B are configured to have opposite winding directions and configured so that end portions 141b are symmetrically disposed at positions furthest from the center line CL of the housing 110 in the longitudinal direction.

As described above, by arranging the pair of flat wire coils 141 at the symmetrical positions with respect to the center line CL of the housing 110 in the longitudinal direction, forming the winding directions of the flat wire coils 141 as the opposite directions, and constituting the pair of flat wire coils 141 so that the upper end portions 141b of the flat wire coils 141 are symmetrically disposed at the positions furthest from the center line CL of the housing 110 to maintain the balance of the circuit configuration of the electromagnetic filter 100 through the two flat wire coils 141, it is possible to improve the filtering performance of the RF power flowing back into the electromagnetic filter through the output port OP and minimize the inductance interference between the two flat wire coils 141.

In addition, in order to minimize an inductance loss due to interaction between the flat wire coil 141 formed of a conductor and the housing 110, as illustrated in FIG. 4, a shortest distance L2 between the center of the flat wire coil 141 adjacent to the side surface 116 of the housing parallel to the center line CL of the housing and the side surface 116 of the housing may be formed to be larger than a distance L1 between the centers of the flat wire coils 141.

With this configuration, it is possible to minimize the electromagnetic interaction between the flat wire coil 141 formed of a conductor and the side surface 116 of the housing, thereby minimizing the inductance loss induced through the flat wire coil 141. In addition, it is possible to minimize the parasitic resistance generated between the flat wire coil 141 and the housing 110.

In another aspect, a shortest distance L2 between the center of the flat wire coil 141 at one side adjacent to the one side surface 116 of the housing parallel to the center line CL of the housing among the pair of flat wire coils 141 and the side surface 116 of the housing may be formed to be larger than a shortest distance L3 between the center of the same flat wire coil 141 and the center line CL of the housing.

Alternatively, a shortest distance L4 between an outer surface of the flat wire coil 141 at one side adjacent to the one side surface 116 of the housing parallel to the center line CL of the housing among the pair of flat wire coils 141 and the side surface 116 of the housing may be formed to be larger than a shortest distance L5 between the outer surfaces of the pair of flat wire coils 141.

Alternatively, the shortest distance L4 between the outer surface of the flat wire coil 141 at one side adjacent to the one side surface 116 of the housing parallel to the center line CL of the housing among the pair of flat wire coils 141 and the side surface 116 of the housing may be formed to be larger than a shortest distance L6 between the outer surface of the same flat wire coil 141 and the center line CL of the housing in the longitudinal direction.

Since it is possible to implement various forms by changing the arrangement form between the pair of flat wire coils 141 formed of a conductor and the side surface 116 of the housing as described above, it is possible to minimize the electromagnetic interaction between the flat wire coil 141 and the housing 110, thereby minimizing the inductance loss induced through the flat wire coil 141 and minimizing the parasitic resistance generated between the flat wire coil 141 and the housing 110.

Meanwhile, FIG. 5 is an enlarged perspective view illustrating major parts in a structure in which a flat wire coil is connected to a second conductive plate through a height adjustment unit, and FIG. 6 is an exploded perspective view illustrating major parts in a detailed structure of the inductor and the height adjustment unit. In addition, FIG. 7 is an operation exemplary view illustrating a state in which the heights of the flat wire coil and the height adjustment unit are adjusted according to a tightening/loosening operation of a first bolt provided on an upper end of the inductor.

Referring to FIGS. 5 to 7, the inductors 140A and 140B include the flat wire coil 141, a lower support member 142, an upper support member 143, and a first bolt 144.

The flat wire coil 141 is a hollow coil formed by spirally wound copper wires (copper wires) having a rectangular cross-sectional shape. The flat wire coil 141 is advantageous for high power transmission because it has a larger conductor cross-sectional area than the annular coil having a general circular cross-section.

In addition, since the general annular coil has a cylindrical outer diameter, severe space waste occurs due to a large number of empty spaces formed between the coils, and a space factor is low due to a small cross-sectional area of the conductor, but since the flat wire coil 141 according to the present disclosure has a smaller number of empty spaces between the coils and a larger cross-sectional area of the conductor, the space factor is relatively high compared to the annular coil. In addition, since the flat wire coil 141 has a shorter length (height) of the coil than the annular coil even when the coil is wound with the same number of windings due to a difference in cross-sectional shape with the annular coil, it is possible to achieve miniaturization and high integration.

By providing the inductor 140 formed of the flat wire coil 141 using various advantages of the flat wire coil to increase integration compared to the annular coil having a circular cross-section, it is possible to achieve the miniaturization and high output of the coil.

The lower support member 142 is fixed to the upper surface of the base plate 120 and supports the flat wire coil 141 from a lower portion thereof. The lower support member 142 includes a disk-shaped fixing portion 142a and a cylindrical fastening portion 142b having a smaller diameter than the fixing portion 142a.

The fixing portion 142a is fixedly fastened to the base plate 120 by allowing a bolt to pass through the housing from the bottom surface of the housing 110 in a state of being seated in the seating groove 122 of the base plate 120.

The fixing portion 142a has an outer diameter corresponding to an outer diameter of the flat wire coil 141, and the fastening portion 142b has an outer diameter corresponding to an inner diameter of the flat wire coil 141. A fastening hole (not illustrated) to which the first bolt 144 may be fastened is formed at the inner center of the fastening portion 142b.

The flat wire coil 141 is fitted into the outer circumference of the fastening portion 142b and seated on the fixing portion 142a. In this case, since the flat wire coil 141 is maintained in a state of being in close contact with an outer circumferential surface of the fastening portion 142b, the flat wire coil 141 does not move in a horizontal direction and may slide only in a longitudinal direction (vertical direction) of the fastening portion 142b. In addition, the outer surface of the flat wire coil 141 may form a support structure that may be stably seated on an upper surface of the fixing portion 142a without being exposed to the outside of the fixing portion 142a.

The upper support member 143 includes a disk-shaped pressing portion 143a corresponding to the fixing portion 142a of the lower support member 142, an insertion portion 143b formed to protrude from a lower portion of the pressing portion 143a and inserted into the fastening portion 142b of the lower support member 142, and an accommodating portion 143c protruding to an upper portion of the pressing portion 143a and accommodating the first bolt 144.

The pressing portion 143a is formed to have the diameter that is the same as that of the fixing portion 142a of the lower support member 142, supports the flat wire coil 141 on the upper portion thereof, and presses the flat wire coil 141 downward.

The insertion portion 143b has an outer diameter corresponding to an inner diameter of the fastening portion 142b of the lower support member 142 and is coupled by being inserted into the fastening portion 142b. In this case, since almost no gap space is formed between the insertion portion 143b and the fastening portion 142b, little movement in the horizontal direction occurs between the lower support member 142 and the upper support member 143, and the insertion portion 143b may be slid only in the vertical direction (vertical direction) along an inner diameter surface of the fastening portion 142b.

In addition, a fastening hole (not illustrated) that may be fastened by allowing the first bolt 144 to pass therethrough from the upper portion of the upper support member 143 is formed at the centers of the pressing portion 143a and the insertion portion 143b.

Since the accommodating portion 143c is formed to protrude in a structure that surrounds a head portion of the bolt in a state in which the first bolt 144 is fastened to the upper support member 143, the head portion of the first bolt 144 is not exposed upward.

In this case, the upper support member 143, the lower support member 142, and the first bolt 144 may be made of a plastic material having low dielectric constant and high rigidity and preferably made of a polyetheretherketone (PEEK) resin material.

The inductors 140A and 140B configured as described above may be fastened by the first bolt 144 in a state in which the lower support member 142 and the upper support member 143 come into contact with the lower portion and the upper portion of the flat wire coil 141, respectively, and the lower support member 142 and the upper support member 143 may elastically press the flat wire coil 141 while pressing the flat wire coil 141 by a fastening strength of the first bolt 144. In this case, the overall height of the flat wire coil 141 is reduced.

Conversely, when the first bolt 144 is loosened in a direction opposite to the fastening direction, an elastic restoring force for restoration to an initial state acts on the flat wire coil 141, and thus the overall height of the flat wire coil 141 may be increased.

As described above, since it is possible to adjust the overall height of the flat wire coil 141 by tightening or loosening the first bolt 144 positioned at the upper end of the inductor 140, it is possible to freely adjust the inductance value of the flat wire coil 141 if necessary.

In addition, since the flat wire coil 141 has the characteristic in which relatively less deformation occurs due to a higher modulus of elasticity than the circular coil, it is possible to finely adjust the height of the flat wire coil 141 using the first bolt 144, thereby enabling the fine adjustment of the inductance of the flat wire coil.

The flat wire coil 141 has the upper end portion 141b connected to the second conductive plates 153 and 154 and the lower end portion 141a connected to the third conductive plates 155 and 156. In this case, the lower end portion 141a positioned at a lowermost end of the flat wire coil 141 may be fastened with the bolts in a state of being in contact with upper portions of the third conductive plates 155 and 156 to maintain the electrical connection state with the third conductive plates 155 and 156, but the upper end portion 141b positioned at an uppermost end of the flat wire coil 141 is positioned at a position spaced by the overall height of the flat wire coil 141 upward from the second conductive plates 153 and 154, and thus may not maintain the direct electrical connection state with the second conductive plates 153 and 154.

Therefore, in the present disclosure, provided is the height adjustment unit 160 that may electrically connect the upper end portion 141b of the flat wire coil 141 to the second conductive plates 153 and 154 and freely change heights between the upper end portion of the flat wire coil 141 and the second conductive plates 153 and 154 at the time of adjusting the height of the flat wire coil 141. A pair of height adjustment units 160 is provided to be connected to the pair of second conductive plates 153 and 154.

The height adjustment units 160A and 160B include bent members 161 coupled to upper surfaces of the second conductive plates 153 and 154, and connecting members 162 connecting the bent members 161 to the upper end portion 141b of the flat wire coil 141.

The bent member 161 is made of a material that is the same as those of the second conductive plates 153 and 154. The bent member 161 includes a horizontal portion 161a coupled to the upper surfaces of the second conductive plates 153 and 154 with bolts, and a vertical portion 161b vertically bent upward from one end of the horizontal portion 161a. The vertical portion 161b includes a slot-shaped long hole 161c formed in the longitudinal direction (vertical direction). The vertical portion 161b is fastened to the connecting member 162 through a second bolt 163 passing through the long hole 161c portion.

The connecting member 162 is made of a material that is the same as those of the second conductive plates 153 and 154. The connecting member 162 forms a structure bent multiple times and connects the upper end portion 141b of the flat wire coil 141 to the vertical portion 161b of the bent member 161. In other words, the one end portion of the connecting member 162 is coupled to the upper end portion 141b of the flat wire coil 141 by being fastened with the bolt on an upper portion thereof in a state of being in contact with a lower surface of the upper end portion 141b of the flat wire coil 141, and the other end portion of the connecting member 162 is coupled to the vertical portion 161b by being fastened with the second bolt 163 on a side portion thereof in a state of being in contact with the vertical portion 161b of the bent member 161.

In this case, the connecting member 162 and the vertical portion 161b are fastened to the end portion of the connecting member 162 by allowing the second bolt 163 to pass through the long hole 161c portion of the vertical portion 161b, and the second bolt 163 passing through the long hole 161c may move in the longitudinal direction (vertical direction) of the long hole 161c before the vertical portion 161b and the connecting member 162 are fastened completely. In other words, the second bolt 163 becomes a state of being movable in the longitudinal direction of the vertical portion 161b along the long hole 161c when the vertical portion 161b and the connecting member 162 are maintained in a loosened state of being not fastened completely.

Therefore, when it is necessary to adjust the height of the flat wire coil 141 to adjust the inductance of the flat wire coil 141, a coupling position between the vertical portion 161b and the connecting member 162 may be easily adjusted to fit the height of the upper end portion 141b of the flat wire coil 141 by first loosening the second bolt 163 fastening the vertical portion 161b of the bent member 161 to the connecting member 162 to become a loosened state, then rotating the first bolt 144 of the upper end of the inductor 140 to adjust the flat wire coil 141 to a required height, and then tightening the second bolt 163 to fix the vertical portion 161b to the connecting member 162.

In addition, by forming a guide groove 161d in one surface of the vertical portion 161b coupled to the end portion of the connecting member 162 and forming a guide protrusion 162a engaged with the guide groove 161d and having a protruded structure movable along the guide groove 161d on the end portion of the connecting member 162, the connecting member 162 may be smoothly moved only in the vertical direction along the vertical portion 161b without moving in the left-right direction by the structure of the guide groove 161d and the guide protrusion 162a at the time of adjusting the height of the flat wire coil 141.

In addition, there is an advantage in that the connecting member 162 may be stably slid along a predetermined path of the guide groove 161d formed in the vertical portion 161b, and the coupling position between the vertical portion 161b and the connecting member 162 may always maintain the coupling at the predetermined coupling position without misplaced in the left-right direction.

Meanwhile, FIGS. 8 and 9 illustrate a grounding structure of a capacitor using a grounding support in the electromagnetic filter according to the present disclosure.

Referring to FIGS. 8 and 9, the electromagnetic filter 100 includes a grounding support 111A capable of grounding capacitors 180A and 180B respectively connected to the first ground line GL1 and the second ground line GL2 on the bottom surface 111 of the housing.

The grounding support 111A has a cylindrical shape and is made of a conductive material that is the same as that of the housing 110. The grounding support 111A is disposed inside a space portion 124 formed at one side of the base plate 120 so that the bottom surface 111 of the housing is exposed and fastened on the bottom surface 111 of the housing using the bolt under the bottom surface 111 on which the space portion 124 is positioned. Therefore, the grounding support 111A is electrically connected to the bottom surface 111 of the housing.

One end portions of the capacitors 180A and 180B are fastened to an upper end of the grounding support 111A through a third bolt 182 in a state of overlapping each other. The grounding support 111A supports the one end portions of the neighboring capacitors 180A and 180B at the bottom and electrically connects the neighboring capacitors 180A and 180B to the bottom surface 111 of the housing.

In this case, "L"-shaped brackets made of a conductive material are coupled to both sides of the capacitors 180A and 180B, and one or more capacitors 180A and 180B of which both sides are coupled to the "L"-shaped brackets are connected to each of the first ground line GL1 branched from the first conductive plates 151 and 152 and the second ground line GL2 branched from the second conductive plates 153 and 154.

In this case, the capacitor 180A connected to the first ground line GL1 has one side fastened to the upper surfaces of the first conductive plates 151 and 152 with a bolt 181 and the other side fastened to the upper end of the grounding support 111A with a third bolt 182 so that the first ground line GL1 branched from the first conductive plates 151 and 152 is grounded to the bottom surface 111 of the housing.

In addition, the capacitor 180B connected to the second ground line GL2 has one side in contact with the end portions of the additional inductors 170A and 170B and fastened to the upper surface of the base plate 120 through a bolt 183 and the other side fastened to the upper end of the grounding support 111A with the third bolt 182 together with the other capacitor 180A so that the second ground line GL2 branched from the second conductive plates 153 and 154 is grounded to the bottom surface 111 of the housing.

In other words, the one end portions of the capacitor 180A connected to the first ground line GL1 and the capacitor 180B connected to the second ground line GL2 are fastened to the upper end of the grounding support 111A with the third bolt 182 in a state of overlapping each other so that the end portions of the neighboring two capacitors 180A and 180B may be simultaneously grounded to the bottom surface 111 of the housing using one grounding support 111A.

With this configuration, it is possible to implement the ground structure in which the capacitors 180A and 180B respectively connected to the first ground line GL1 and the second ground line GL2 are stably supported through the base plate 120 portion and the grounding support 111A portion and connected to the bottom surface of the housing through the grounding support 111A formed of a conductor.

In addition, a plurality of capacitors 180A and 180B may be connected to the first ground line GL1 or the second ground line GL2 depending on the design specifications of the electromagnetic filter 100. For example, as in the embodiment illustrated in FIGS. 7 and 8, when two capacitors 180A-1 and 180A-2 are connected to the second ground line GL2, the two capacitors 180A-1 and 180A-2 may be disposed in the vertical direction and coupled by being fastened to the upper surfaces of the first conductive plates 151 and 152 and the upper end portion of the grounding support 111A in a state in which both end portions overlap each other.

As described above, by adopting a structure in which the end portions of the neighboring two capacitors 180A and 180B in the horizontal direction overlap each other or the end portions of the neighboring two capacitors 180A-1 and 180A-2 in the vertical direction overlap each other, are fastened to the upper end of the grounding support 111A with the third bolt 182, and grounded to the housing 110, it is possible to form the ground structure using the minimum number of grounding supports 111A and bolts 182. Therefore, when a plurality of capacitors are mounted inside the housing 110, there is an advantage in that it is possible to more efficiently achieve space arrangement utilization.

FIG. 10 is a circuit diagram illustrating a circuit configuration of the electromagnetic filter according to the present disclosure.

Referring to FIG. 10, the components of the electromagnetic filter according to the present disclosure described with reference to FIGS. 1 to 9 are illustrated. Terminals TB1 and TB2 are terminals corresponding to the input port IP, and terminals TB3 and TB4 are terminals corresponding to the output port OP.

The electromagnetic filter 100 according to the present disclosure may include a first filter unit for blocking high-frequency noise, a second filter unit for blocking low-frequency noise, and a transformer 130 connecting the first filter unit to the second filter unit.

The first filter unit may include the inductors 140A and 140B and the capacitors 180B. In particular, the first filter unit according to the present disclosure may include the inductors 140A and 140B having a variable inductance. Therefore, the first filter unit may effectively function to block the noise without the capacitors (e.g., variable capacitors) connected in parallel with the inductors 140A and 140B.

The second filter unit may include the capacitors 180A. According to the embodiments, the second filter unit may optionally further include the additional inductors 170A and 170B.

The transformer 130 may be connected between the first filter unit and the second filter unit. For example, the first filter unit may be connected to a primary coil of the transformer 130, and the second filter unit may be connected to a secondary coil of the transformer 130. Therefore, the electromagnetic filter according to the present disclosure may include both a high-frequency filter for blocking high-frequency components and a low-frequency filter for blocking low-frequency components.

Meanwhile, FIGS. 11 to 18 illustrate an electromagnetic filter structure according to a second embodiment of the present disclosure.

The electromagnetic filter according to the present disclosure illustrated in FIGS. 11 to 18 has a basic configuration that is the same as that of the electromagnetic filter structure of the first embodiment and differs only in a structure of the inductor and the conductive plate portion connecting the inductor to the output port. Therefore, hereinafter, detailed description will be made focusing on a configuration that differs from the electromagnetic filter structure of the first embodiment, and overlapping descriptions of the configuration that is the same as that of the first embodiment will be omitted.

In addition, in the electromagnetic filter structure to be described below, since component illustrated in the drawings but not specifically mentioned are the same as the components illustrated in the first embodiment, separate overlapping descriptions of these same components will also be omitted. In addition, the components that are the same as those of the first embodiments will be described by using the same reference numerals.

Referring to FIGS. 11 to 16, an electromagnetic filter 100-1 according to the second embodiment of the present disclosure includes the housing 110 made of an electrically conductive metal material, the input port IP and the output port OP provided on both side surfaces facing the housing 110, the base plate 120 made of an electrically insulating material and installed on the bottom surface 111 of the housing, an inductor 140-1 installed on the upper surface of the base plate 120 and connected to the output port OP, the plurality of conductive plates 150 installed on the upper surface of the base plate 120 and electrically connecting between the input port IP and the inductor 140-1 and between the inductor 140-1 and the output port OP, and a variable plate 157 electrically connected to the conductive plates 155 and 156 at one side among the plurality of conductive plates 150 and installed to be moved horizontally with respect to the conductive plates 155 and 156.

The base plate 120 has a basic shape that is the same as that of the base plate 120 of the first embodiment, but the shape of a portion to which the third conductive plates 155 and 156 connecting between the inductors 140A-1 and 140B-1 and the output port OP are fixed somewhat differs from the structure of the base plate 120 of the first embodiment.

The base plate 120 according to the second embodiment of the present disclosure has a structure in which the portion on which the third conductive plates 155 and 156 are seated extends a predetermined length toward the output port OP. This is to provide a space for installation and movement of the variable plate 157.

An accommodating groove 125 in which the variable plate 157 may be accommodated is formed in the upper surface of the base plate 120. The accommodating groove 125 may have a shape corresponding to the shape of the variable plate 157, and for example, the shape of the accommodating groove 125 viewed from the upper portion of the base plate 120 may be a rectangular shape. In this case, a short side of the accommodating groove 125 is parallel to the longitudinal direction of the base plate 120, and a long side thereof is perpendicular to the longitudinal direction of the base plate 120. This corresponds to the arrangement structure of the third conductive plates 155 and 156 having an "L" shape.

The variable plate 157 electrically connected to the third conductive plates 155 and 156 is accommodated and seated inside the accommodating groove 125.

The variable plate 157 is made of an electrically conductive metal material that is the same as those of the third conductive plates 155 and 156 and preferably, may be made of copper (Cu) having high electrical conductivity.

The variable plate 157 may be formed in a rectangular shape, but is not limited thereto. When the variable plate 157 has a rectangular shape, a length of the long side of the accommodating groove 125 in which the variable plate 157 is accommodated is formed to a length corresponding to the length of the long side of the variable plate 157, while a length of the short side of the accommodating groove 125 is formed to be larger than a length of the short side of the variable plate 157 and formed so that the variable plate 157 may be moved in the longitudinal direction of the short side of the variable plate 157.

In other words, the length W1 of the short side of the accommodating groove 125 is formed to further extend a predetermined width than the length W2 of the short side of the variable plate 157 so that the variable plate 157 seated inside the accommodating groove 125 may be moved by a set distance in the front-rear direction (longitudinal direction of the base plate).

The plates 155, 156, and 157 may be formed by being cut and machined from one large conductive plate, and in this case, a thickness of the variable plate 157 may be formed to be the same as thicknesses of the third conductive plates 155 and 156. However, the plates 155, 156, and 157 may be formed to have different thicknesses. In addition, a recessed depth of the accommodating groove 125 in which the variable plate 157 is accommodated may also be formed to a recessed depth corresponding to the thickness of the variable plate 157.

The third conductive plates 155 and 156 are disposed above the variable plate 157 in a state of being seated inside the accommodating groove 125. In other words, the variable plate 157 is disposed under the third conductive plates 155 and 156.

According to the embodiments, portions of lower surfaces of the third conductive plates 155 and 156 come into contact with a bottom surface of the seating groove 126 formed in the upper surface of the base plate 120, and the other portions thereof come into contact with the upper surface of the variable plate 157. In other words, the third conductive plates 155 and 156 are simultaneously supported by the upper surface of the base plate 120 and the upper surface of the variable plate 157.

The accommodating groove 125 of the base plate 120 is disposed at a lower position than the seating groove 126. In other words, an inner bottom surface of the accommodating groove 125 is disposed at a lower position than an inner bottom surface of the seating groove 126, and each of the bottom surfaces is connected in a stepped shape.

The variable plate 157 is electrically connected to the third conductive plates 155 and 156 under the third conductive plates 155 and 156. In this case, the variable plate 157 always maintains continuous electrical connection with the third conductive plates 155 and 156 positioned thereabove even when moving in the front-rear direction (longitudinal direction of the base plate) in the accommodating groove 125.

When the variable plate 157 moves in the accommodating groove 125, a conductor area formed by the third conductive plates 155 and 156 and the variable plate 157 changes. In other words, when the variable plate 157 moves forward with respect to the third conductive plates 155 and 156 in a fixed state, the conductor area formed by the third conductive plates 155 and 156 and the variable plate 157 according to a distance at which the variable plate 157 moves forward. This causes an increase in parasitic capacitance generated between the variable plate 157 and the bottom surface 111 of the housing formed of a conductor. In this case, the base plate 120 may function as a dielectric between one conductor formed of the third conductive plates 155 and 156 and the variable plate 157 and the other conductor formed of the bottom surface 111 of the housing to form a parasitic capacitor between the variable plate 157 and the bottom surface 111 of the housing.

The third conductive plates 155 and 156 may be fixedly fastened to the upper surface of the base plate 120 through a plurality of bolts 158 (two in the embodiment) as in the first embodiment. In this case, the variable plate 157 may also be fixedly fastened to the base plate 120 together with the third conductive plates 155 and 156 using a plurality of bolts 158 for fastening the third conductive plates 155 and 156.

In this case, fastening positions of the two bolts 158 for fastening the third conductive plates 155 and 156 may be positioned in an inner space of the accommodating groove 125. In other words, the fastening position of the bolts 158 may be positioned in the inner space of the accommodating groove 125 so that the third conductive plates 155 and 156 and the variable plate 157 are fastened together through the two bolts 158. With this configuration, the third conductive plates 155 and 156 and the variable plate 157 are each fastened without using separate bolts, it is possible to reduce the number of fastened components and it is not necessary to additionally secure a separate space for bolt fastening.

The variable plate 157 is formed with two long holes 157a and 157b through which the two bolts 158 may pass and move to enable simultaneous fastening with the third conductive plates 155 and 156. In other words, since the two bolts 158 fastening the third conductive plates 155 and 156 pass through each of the long holes 157a and 157b formed in the variable plate 157 and are fastened to the bottom surface portion of the accommodating groove 125, the third conductive plates 155 and 156 and the variable plate 157 may be fixedly fastened to the base plate 120 through the two bolts 158.

The two long holes 157a and 157b formed in the variable plate 157 are disposed parallel to a moving direction (front-rear direction) of the variable plate 157. In this case, lengths of the long holes 157a and 157b correspond to a distance at which the variable plate 157 may move in the front-rear direction in the accommodating groove 125.

The long holes 157a and 157b may be formed in a hole structure in which both ends are closed, but formed in a structure in which one ends of the long holes 157a and 157b are open as in the embodiment of the present disclosure. In other words, the one ends of the long holes 157a and 157b positioned relatively close to the third conductive plates 155 and 156 may have a form that is open to the outside of the variable plate 157.

This may contribute to reducing the length W2 of the short side of the variable plate 157. In other words, when both ends of the long holes 157a and 157b are formed in a closed structure, the length W2 of the short side of the variable plate 157 is inevitably relatively large compared to a structure in which the one ends of the long holes are open. In this case, it may be relatively disadvantageous in terms of securing the movement distance of the variable plate 157 in the front-rear direction in the inner space of the accommodating groove 125 having a narrow width of the short side.

In other words, since the length W1 of the accommodating groove 125 in the front-rear direction should be increased to secure the movement distance of the variable plate 157 in the front-rear direction, the overall length of the base plate 120 also increases, and the overall length of the electromagnetic filter 100-1 also increases, and thus there is a disadvantage in achieving miniaturization of the device. Therefore, when the one ends of the long holes 157a and 157b are formed in an open structure, the length W1 of the accommodating groove 125 in the front-rear direction for securing the movement distance of the variable plate 157 in the front-rear direction is also reduced, and thus there is an advantage in that it is possible to reduce the length of the base plate 120, thereby enabling the miniaturization of the electromagnetic filter 100-1.

In addition, the accommodating groove 125 in which the variable plate 157 is accommodated may be formed in a structure in which one side is open. In other words, the long side portion of one side of the accommodating groove 125 close to the side surface 114 of the housing may be formed in a structure that is open toward the side surface 114 of the housing.

in this structure, when the variable plate 157 is pushed into the accommodating groove 125 through a space of the open long side portion of the one side in a state in which the third conductive plates 155 and 156 are seated in the seating groove 126 of the base plate 120 and temporarily assembled with the bolt 158, the bolt 158 fastening the third conductive plates 155 and 156 is inserted into the long holes 157a and 157b through the open ends of the long holes 157a and 157b, and when the bolt 158 is completely tightened in this state, the variable plate 157 may be easily installed in the space of the accommodating groove 125 positioned under the third conductive plates 155 and 156.

With this structure, it is possible to overcome a burden work that completely loosens the bolt 158 fastening the third conductive plates 155 and 156, completely separating the third conductive plates 155 and 156 from the base plate 120, and then replacing the variable plate 157 when the replacement work of the variable plate 157 is required. In other words, the replacement work of the variable plate 157 may be performed more easily through the work that loosens the bolt 158 fastening the third conductive plates 155 and 156 and then draws the variable plate 157 through the space of the open long side of the one side of the accommodating groove 125 when the replacement of the variable plate 157 is required.

In the embodiment, an example in which the structure in which the two long holes 157a and 157b are formed parallel to each other in the variable plate 157 is described, but in a case in which the third conductive plates 155 and 156 and the variable plate 157 are fixed by using one bolt, one long holes may be provided in the variable plate 157. Of course, when the variable plate 157 is fixed through two or more bolts, the number of long holes may be configured to change to fit the number of bolts used.

However, in order to simultaneously satisfy various advantages capable of providing a guide function by the long hole when the variable plate 157 moves in the front-rear direction and at the same time securing a strong coupling strength while reducing the number of bolts used, it is most preferable to provide the two long holes 157a and 157b in the variable plate 157.

As described above, the accommodating groove 125 may be formed to have a structure in which the long side portion of the one side close to the side surface 114 of the housing is open toward the side surface 114 of the housing. When the accommodating groove 125 is formed in this structure, the variable plate 157 may be further drawn out forward through the open portion of the accommodating groove 125. Therefore, since the total conductor area formed by the variable plate 157 and the third conductive plate 155 and 156 is greatly increased, it is possible to increase the parasitic capacitance generated between the variable plate 157 and the bottom surface 111 of the housing.

In contrast, the accommodating groove 125 may be formed in a structure in which the long side portion close to the side surface 114 of the housing is closed. In other words, as described in the embodiment, a protruding wall 125a in a shape protruding upward at a position between the variable plate 157 and the side surface 114 of the housing 110 may be formed in the accommodating groove 125.

As described in the embodiment, since the protruding wall 125a may be formed in a form in which the long side portion of the accommodating groove 125 close to the side surface 114 of the housing is closed, the accommodating groove 125 may be formed to have a complete rectangular groove shape. In this case, the protruding wall 125a may be formed to be disposed at an inner position of the accommodating groove 125 rather than one end portion of the accommodating groove 125.

Since the protruding wall 125a functions as a dielectric between the side surface 114 of the housing formed of a conductor and the variable plate 157, the parasitic capacitance is generated between the side surface 114 of the housing 110 and the variable plate 157.

Here, since changes in thickness and area of the variable plate 157 formed of a conductor are limited due to the design structure, the parasite capacitance may be variably adjusted easily by adjusting a horizontal width of the protruding wall 125a functioning as a dielectric or adjusting a distance between the side surface 114 of the housing 110 and the variable plate 157.

In addition, since the distance at which the variable plate 157 may move in the horizontal direction with respect to the side surface 114 of the housing 110 is inevitably limited due to the mechanical design structure, when the horizontal width, the material, the shape, or the like of the protruding wall 125a functioning as a dielectric changes, there is an advantage in that it is possible to secure relatively various parasitic capacitance values even at the limited movement distance.

For example, when the adjustment of the capacitance by the variable plate 157 is required, the bolt 158 fastening the third conductive plates 155 and 156 is slightly loosened to reduce the fastening strength between the third conductive plates 155 and 156 and the variable plate 157, then the variable plate 157 is horizontally moved to a required specific position, and then the bolt 158 may be fixedly re-tightened.

When the variable plate 157 is further moved to a front position close to the side surface 114 of the housing, an electrode area formed by the variable plate 157 moved to the front position from the third conductive plates 155 and 156 increases. Therefore, since an effective area overlapping the bottom surface 111 of the housing formed of a conductor increases, the parasitic capacitance generated between the variable plate 157 and the bottom surface 111 and the housing increases. In addition, when the variable plate 157 moves forward, a distance to the side surface 114 of the housing decreases, and thus the parasitic capacitance generated between the variable plate 157 and the side surface 114 of the housing also increases (the capacitance is inversely proportional to a distance between two conductors).

For example, as illustrated in the operation example illustrated in FIG. 17, when the variable plate 157 is maximally moved rearward in the accommodating groove 125, a horizontal width S1 of the variable plate 157 not overlapping the third conductive plates 155 and 156 may be 2.5 mm. In other words, when the variable plate 157 is maximally moved rearward, a front end of the variable plate 157 may be positioned at a position moving forward by 2.5 mm with respect to the front ends of the third conductive plates 155 and 156.

On the other hand, when the variable plate 157 is maximally moved forward in the accommodating groove 125, a horizontal width S2 of the variable plate 157 not overlapping the third conductive plates 155 and 156 may be 6 mm. In other words, when the variable plate 157 is maximally moved forward, the front end of the variable plate 157 may be positioned at a position moving forward by 6 mm with respect to the front ends of the third conductive plates 155 and 156. Here, the numerical value of the horizontal movement width of the variable plate 157 in the front-rear direction in the accommodating groove 125 may vary depending on the design.

As described above, as the variable plate 157 connected to the lower portions of the third conductive plate 155 and 156 is moved in the front-rear direction, the area of the conductor formed by the third conductive plate 155 and 156 and the variable plate 157 changes, and thus an effective area overlapping the bottom surface 111 of the housing changes, making it possible to adjust the parasitic capacitance with the bottom surface 111 of the housing. In addition, as the variable plate 157 is moved in the front-rear direction, a distance between the variable plate 157 and the side surface 114 of the housing increases or decreases, making it possible to adjust the parasitic capacitance generated between the variable plate 157 and the side surface 114 of the housing.

Meanwhile, FIG. 14 is an exploded perspective view of major parts illustrating a specific configuration of the variable plate 157 and the inductor 140-1 according to the present disclosure.

Referring to FIG. 14, the inductor 140-1 according to the present disclosure includes a pair of inductors 140A-1 and 140B-1 connected between the second conductive plates 153 and 154 and the third conductive plates 155 and 156.

Specifically, the inductors 140A-1 and 140B-1 include the flat wire coil 141, the lower support member 142 supporting the flat wire coil 141 at the bottom, the upper support member 143 supporting the flat wire coil 141 at the top, and the coil cover 145 surrounding the flat wire coil 141 and the upper and lower support members 142.

A central axis of the flat wire coil 141 is disposed perpendicular to the upper surface of the base plate 120. In other words, the flat wire coil 141 is disposed upright in the vertical direction (vertical direction) with respect to the upper surface of the base plate 120. Since the flat wire coil 141 is the same as the flat wire coil of the first embodiment, separate overlapping description thereof will be omitted.

The lower support member 142 is fixed to the upper surface of the base plate 120 and supports the flat wire coil 141 at the bottom. The lower support member 142 includes the disk-shaped fixing portion 142a and the cylindrical fastening portion 142b having a smaller diameter than the fixing portion 142a.

The fixing portion 142a is fixedly fastened to the base plate 120 by allowing the bolt 146 to pass through the base plate 120 from the bottom of the base plate 120 in a state of being seated in the seating groove 122 formed in the upper surface of the base plate 120. In this case, the fixing portion 142a has the outer diameter corresponding to the outer diameter of the flat wire coil 141, and the fastening portion 142b has the outer diameter corresponding to the inner diameter of the flat wire coil 141.

The upper support member 143 includes the disk-shaped pressing portion 143a corresponding to the fixing portion 142a of the lower support member 142, and the insertion portion 143b protruding downward from the center of the pressing portion 143a and partially inserted into the fastening portion 142b of the lower support member 142.

The pressing portion 143a may be formed to have the diameter that is the same as that of the fixing portion 142a of the lower support member 142, may support the flat wire coil 141 at the top, and press the flat wire coil 141 downward.

An annular groove 143d into which the end portion of the first bolt 144 to be described below may be partially inserted is formed in the center of the upper surface of the pressing portion 143a. The annular groove 143d may function as a guide for guiding the end portion of the first bolt 144 to be in contact with an accurate position of the pressing portion 143a when the end portion of the first bolt 144 comes into contact with the upper surface of the pressing portion 143a and presses the pressing portion 143a. In other words, the annular groove 143d functions to guide the end portion of the first bolt 144 to be in contact with the accurate center position of the pressing portion 143a and press the pressing portion 143a when the end portion of the first bolt 144 comes into contact with and presses the pressing portion 143a.

The insertion portion 143b has a filled cylindrical shape. The insertion portion 143b has the outer diameter corresponding to the inner diameter of the fastening portion 142b of the lower support member 142 and is coupled by being partially inserted into the fastening portion 142b In this case, since almost no gap space is formed between the insertion portion 143b and the fastening portion 142b, little movement in the horizontal direction occurs between the lower support member 142 and the upper support member 143, and the insertion portion 143b may be slid only in the vertical direction (vertical direction) along the inner diameter surface of the fastening portion 142b, and thus a height distance between the lower support member 142 and the upper support member 143 may change.

The coil cover 145 is installed to protect the flat wire coil 141. The coil cover 145 is disposed in a structure that surrounds the entirety of the lower support member 142, the flat wire coil 141, and the upper support member 143 and fixed to the base plate 120.

The coil cover 145 has a hexahedral-shaped exterior and has a square shape when viewed from the top. On the other hand, the coil cover 145 has the inside formed in a circular inner circumferential shape corresponding to the shape of the outer surface of the flat wire coil 141.

A plurality of ventilation holes 145a horizontally passing through the inside and outside of the coil cover 145 to discharge internal heat to the outside are formed in the perimeters of the side surfaces of the coil cover 145 surrounding the flat wire coil 141. Therefore, even when the temperature inside the coil cover 145 increases due to heat generation of the flat wire coil 141, the internal heat is effectively discharged to the outside through the plurality of ventilation holes 145a, and thus it is possible to prevent the overheating of the flat wire coil 141.

A plurality of coupling protrusions 145b protruding downward to be coupled to the base plate 120 are formed on a lower surface of the coil cover 145. The plurality of coupling protrusions 145b may be formed on four corner regions of the lower surface of the coil cover 145 and disposed at equal intervals.

In addition, a plurality of coupling grooves 127 having a shape corresponding to the coupling protrusions 145b formed on the coil cover 145 are formed in the upper surface of the base plate 120. Therefore, since the coupling protrusions 145b of the coil cover 145 may be coupled to the plurality of coupling grooves 127 formed in the base plate 120 in a forcibly-fitting manner, the coil cover 145 may be fixed to the upper surface of the base plate 120.

Since a main function of the coil cover 145 is to protect the flat wire coil 141 from the outside, a relatively large fastening strength is not required to be coupled to the base plate 120 unlike other components. Therefore, the coil cover 145 may be structurally and firmly fixed to the base plate 120 only by the coupling strength between the plurality of coupling protrusions 145b and the coupling grooves 127 without using a separate fastening unit such as a bolt.

As illustrated in FIG. 16, an inner upper surface of the coil cover 145 in a state of being coupled to the base plate 120 is disposed at a position that is a predetermined distance higher than the upper surface of the upper support member 143. In other words, the upper surface of the upper support member 143 and the inner upper surface of the coil cover 145 do not come into contact with each other because they are formed in a structure that is spaced by a predetermined distance from each other.

On the other hand, a contact portion 145f protruding downward to be in contact with the upper surface of the upper support member 143 is formed on the inner upper surface of the coil cover 145. The contact portion 145f is positioned on a central portion of the inner upper surface of the coil cover 145 and formed to protrude to have the shape of a filled cylindrical shape. In this case, a length of the contact portion 145f protruding downward corresponds to a separation distance between the upper surface of the upper support member 143 and the inner upper surface of the coil cover 145.

A fastening hole 145g having a thread structure to which the first bolt 144 is fastened is formed at the center of the contact portion 145f. The fastening hole 145g is formed in a structure that passes through the contact portion 145f in the vertical direction. In this case, a cross-sectional diameter width of the contact portion 145f may be formed to correspond to a diameter width of the insertion portion 143b of the upper support member 143 to prevent the structural strength from being weakened due to the formation of the fastening hole 145g at the center thereof.

A protruding portion 145c having a hexahedral shape corresponding to the exterior of the coil cover 145 and protruding upward is formed at the center of the upper surface of the coil cover 145. In addition, an insertion hole 145d allowing the first bolt 144 to be inserted from the top is formed in the protruding portion 145c portion. In this case, the insertion hole 145d is formed in a circular hole shape and communicates with the fastening hole 145g of the contact portion 145f positioned thereunder.

In this case, as illustrated in FIG. 16, a height of the protruding portion 145c may be formed to have a height that may fully have the first bolt 144 to prevent the first bolt 144 fastened to the contact portion 145f from being exposed to the outside of the protruding portion 145c due to a longitudinal cross-sectional structure.

The first bolt 144 is inserted downward from the top of the protruding portion 145c through the insertion hole 145d and fastened to the fastening hole 145g of the contact portion 145f. In addition, a lower end of the first bolt 144 fastened to the contact portion 145f may be inserted into the annular groove 143d formed in the upper surface of the upper support member 143 and may come into contact with a bottom surface of the annular groove 143d. In this case, an inclined surface having an inclined shape may be formed on an outer surface of the end portion of the first bolt 144 or an inner surface of the annular groove 143d to facilitate the initial insertion of the end portion of the first bolt 144 into the annular groove 143d.

The upper support member 143, the lower support member 142, the coil cover 145, and the first bolt 144 constituting the inductor 140-1 according to the present disclosure may be made of a PEEK material having low dielectric constant, high mechanical strength, excellent heat resistance, and chemical resistance. When the upper support member 143, the lower support member 142, the coil cover 145, and the first bolt 144 are made of the PEEK material, it is possible to secure stable durability even when used repeatedly in a high temperature harsh environment.

FIG. 18 illustrates a state in which the height of the flat wire coil 141 is adjusted by the rotation of the first bolt 144. Here, in actual products, the height of the flat wire coil 141 is finely adjusted by the rotation of the first bolt 144, but FIG. 18 is somewhat exaggeratedly illustrated to facilitate understanding of the operation.

A left side in FIG. 18 illustrates a state in which the height of the flat wire coil 141 is expanded, and in this state, since the contact portion 145f formed inside the coil cover 145 comes into contact with the upper surface of the upper support member 143 and supports the upper support member 143 through pressing with a small force, the flat wire coil 141 is slightly expanded by its own elasticity to maintain a predetermined height.

On the other hand, as illustrated in a right side of FIG. 18, when the first bolt 144 is rotated clockwise, the first bolt 144 moves down along the contact portion 145f to press the upper support member 143 in a state of being in contact with the contact portion 145f downward, and as the upper support member 143 is pressed downward, the flat wire coil 141 supported between the upper support member 143 and the lower support member 142 is elastically compressed, and thus the overall height of the flat wire coil 141 is reduced.

In this state, when the first bolt 144 is rotated counterclockwise, the upper support member 143 is moved up by an elastic restoring force of the flat wire coil 141 while the first bolt 144 moves upward, and as the upper support member 143 moves up, the flat wire coil 141 supported between the upper support member 143 and the lower support member 142 is elastically expanded, and thus the overall height of the flat wire coil 141 is re-expanded. In this case, an upward movement width of the upper support member 143 moving up is limited to the lower surface of the contact portion 145f of the coil cover 145. In other words, even when the upper support member 143 moves up due to the elastic restoring force of the flat wire coil 141, the upper support member 143 may move only up to a height at which the upper support member 143 comes into contact with the lower surface of the contact portion 145f.

In this case, the upper support member 143 and the contact portion 145f do not always maintain the contact state and may selectively maintain the contact state depending on the vertical position of the first bolt 144. In addition, the first bolt 144 and the upper support member 143 may also selectively maintain the contact state depending on the vertical position of the first bolt 144.

As described above, since the height of the flat wire coil 141 is adjusted through the operation of loosening or tightening the first bolt 144 disposed on the upper protruding portion 145c portion of the coil cover 145, the inductance value of the flat wire coil 141 may be freely adjusted if necessary.

Meanwhile, since the flat wire coil 141 is installed upright on the upper surface of the base plate 120, the both end portions 141a and 141b of the flat wire coil 141 are inevitably positioned at different heights.

In other words, the lower end portion 141a of the flat wire coil 141 connected to the third conductive plates 155 and 156 is positioned at a lowermost end of the flat wire coil, while the upper end portion 141b of the flat wire coil 141 connected to the second conductive plates 153 and 154 is positioned at an uppermost end thereof.

The lower end portion 141a positioned at the lowermost end of the flat wire coil 141 may have a separation space between the lower surface of the coil cover 145 and the upper surface of the base plate 120 and may be drawn out to the outside of the coil cover 145 to be connected to the third conductive plates 155 and 156, but the upper end portion 141b positioned at the uppermost end of the flat wire coil 141 may be directly connected to the second conductive plates 153 and 154 due to the height difference with the second conductive plates 153 and 154 fixed to the upper surface of the base plate 120.

Therefore, the upper end portion 141b positioned at the uppermost end of the flat wire coil 141 should be connected to the second conductive plates 153 and 154 positioned thereunder through a separate electrical connecting unit and require a specific structure capable of maintaining continuous electrical connection while a height is changed depending on a change in height of the flat wire coil 141 due to the design structure configured to adjust the height of the flat wire coil 141.

To this end, the height adjustment unit 160, which may electrically connect the flat wire coil 141 to the second conductive plates 153 and 154 and maintain the continuous electrical connection between the flat wire coil 141 and the second conductive plates 153 and 154 while the height is changed depending on the change in height of the flat wire coil 141, is provided between the upper end portion 141b of the flat wire coil 141 and the second conductive plates 153 and 154.

Since the height adjustment unit 160 connecting the upper end portion 141b of the flat wire coil 141 to the second conductive plates 153 and 154 has a specific component configuration and an operation mechanism that are the same as those of the height adjustment unit 160 described in the first embodiment, regarding the height adjustment unit 160, the first embodiment is referred to, and separate overlapping description will be omitted.

Meanwhile, as described above, the height of the flat wire coil 141 is configured to be adjusted through the first bolt 144 to adjust the inductance value of the flat wire coil 141. In this case, as the height of the flat wire coil 141 changes, the height of the upper end portion 141b of the flat wire coil also changes, and thus the coil cover 145 also needs a design structure considering this.

To this end, the opening 145e having a predetermined area in which the upper end portion 141b of the flat wire coil 141 may be drawn out to the outside of the coil cover 145 is formed in the coil cover 145 portion in which the upper end portion 141b of the flat wire coil 141 is positioned. Therefore, the upper end portion 141b of the flat wire coil 141 may be drawn out to the outside by passing through the coil cover 145 in the horizontal direction through the opening 145e.

In addition, since the upper end portion 141b of the flat wire coil should move in the vertical direction through the opening 145e when the height of the flat wire coil 141 is adjusted by the first bolt 144, the opening 145e may also be formed to have a length corresponding to a vertical movement trajectory of the upper end portion 141b of the flat wire coil. In this case, the shape of the opening 145e is formed in a rectangular shape having a vertically extending shape to prevent the coil cover 145 from being interfered with the upper end portion 141b of the flat wire coil when the coil cover 145 is installed, and it is preferable that a lower region of the opening 145e is formed to have a structure that is open to a lower portion of the coil cover 145.

Although the preferred embodiments of the present disclosure have been described above, the scope of the present disclosure is not limited to only these specific embodiments, and those skilled in the art can appropriately modify the present disclosure within the scope described in the claims of the present disclosure.

DESCRIPTION OF REFERENCE NUMERALS

| | |
|---|---|
| 100, 100-1: electromagnetic filters | 110: housing |
| 111A: grounding support | 120: base plate |
| 125: accommodating groove | 127: coupling groove |
| 130: transformer | 140, 140-1: inductors |
| 141: flat wire coil | 142: lower support member |
| 143: upper support member | 144: first bolt |
| 145: coil cover | 145a: ventilation hole |
| 145b: coupling protrusion | 145c: protruding portion |
| 145d: insertion hole | 145e: opening |
| 145f: contact portion | 150: conductive plate |
| 151,152: first conductive plates | |
| 153,154: second conductive plates | |
| 155,156: third conductive plates | |
| 157: variable plate | 157a, 157b: long holes |
| 160: height adjustment unit | 161: bent member |
| 162: connecting member | 163: second bolt |
| 170: additional inductor | 180: capacitor |
| 182: third bolt | IP: input port |
| OP: output port | |

The invention claimed is:

1. An electromagnetic filter comprising:
a housing made of an electrically conductive metal material;
an input port and an output port each provided on one of both facing side surfaces of the housing;
a base plate made of an electrically insulating material and installed above a bottom surface of the housing;
an inductor including a flat wire coil having a center axis disposed perpendicular to an upper surface of the base plate and installed on the upper surface of the base plate to be connected to the output port; and
a plurality of conductive plates fixed to the upper surface of the base plate and connecting between the input port and the inductor and between the output port and the inductor.

2. The electromagnetic filter of claim 1, wherein the inductor includes:
a lower support member fixed to the upper surface of the base plate and configured to support the flat wire coil at a bottom;
an upper support member configured to support the flat wire coil at a top; and
a first bolt configured to fasten the upper support member to the lower support member with the flat wire coil interposed therebetween, and
is configured so that a height of the flat wire coil is adjusted by tightening or loosening the first bolt.

3. The electromagnetic filter of claim 2, comprising a height adjustment unit which connects an upper end portion of the flat wire coil to the conductive plate and of which a height changes depending on a height of the flat wire coil.

4. The electromagnetic filter of claim 3, wherein the height adjustment unit includes:
a bent member including a horizontal portion coupled to an upper surface of the conductive plate, and a vertical portion having a long hole in a longitudinal direction formed therein, perpendicular to the horizontal portion and bent upward; and
a connecting member of which one side is coupled to the upper end portion of the flat wire coil and the other side is coupled to the vertical portion through a second bolt passing through the long hole.

5. The electromagnetic filter of claim 4, wherein a guide groove is formed in the longitudinal direction on one surface of the vertical portion coupled to the connecting member, and
a guide protrusion movable along the guide groove in a state of being engaged with the guide groove is formed on the connecting member.

6. The electromagnetic filter of claim 2, wherein materials of the upper support member, the lower support member, and the first bolt include polyetheretherketone (PEEK) resin.

7. The electromagnetic filter of claim 3, further comprising:
a transformer connected in series between the input port and the inductor through the plurality of conductive plates fixed to the upper surface of the base plate; and
a plurality of capacitors connected in parallel with the transformer through the plurality of conductive plates and grounded to the housing.

8. The electromagnetic filter of claim 7, wherein the conductive plate includes:
a plurality of first conductive plates connecting the input port to the transformer;
a plurality of second conductive plates connecting the transformer to the inductor; and a plurality of third conductive plates connecting the inductor to the output port.

9. The electromagnetic filter of claim 8, wherein the upper end portion of the flat wire coil is connected to the second conductive plate through the height adjustment unit, and
   a lower end portion of the flat wire coil is connected to the third conductive plate.

10. The electromagnetic filter of claim 8, further comprising:
   a first ground line branched from the first conductive plate and grounded to the housing; and
   a second ground line branched from the second conductive plate and grounded to the housing,
   wherein one or more capacitors are connected to each of the first ground line and the second ground line.

11. The electromagnetic filter of claim 10, wherein an additional inductor having a circular cross section is connected between the second conductive plate and the capacitor connected to the second ground line.

12. The electromagnetic filter of claim 10, further comprising a grounding support having a structure protruding upward from the bottom surface of the housing and configured to support end portions of the capacitors connected to each of the first ground line and the second ground line.

13. The electromagnetic filter of claim 12, wherein end portions of neighboring two capacitors are connected by being fastened to an upper surface of the grounding support through a third bolt in a state of overlapping each other.

14. The electromagnetic filter of claim 1, wherein a pair of flat wire coils is provided at symmetrical positions with respect to a center line of the housing in a longitudinal direction, and the pair of flat wire coils has opposite winding directions.

15. The electromagnetic filter of claim 1, further comprising a variable plate electrically connected to the conductive plate and installed to move horizontally with respect to the conductive plate.

16. The electromagnetic filter of claim 15, wherein a recessed-shaped accommodating groove in which the variable plate is accommodated is formed in the upper surface of the base plate, and
   the variable plate is installed to move horizontally inside the accommodating groove.

17. The electromagnetic filter of claim 16, wherein a protruding wall protruding upward at a position between the variable plate and a side surface of the housing is formed in the accommodating groove.

18. The electromagnetic filter of claim 15, wherein at least one long hole is formed in the variable plate to enable fastening and movement of a bolt fastening the conductive plate to the base plate.

* * * * *